(12) United States Patent
Park

(10) Patent No.: US 9,754,675 B2
(45) Date of Patent: Sep. 5, 2017

(54) MEMORY SYSTEM AND OPERATION METHOD THEREOF

(71) Applicant: SK hynix Inc., Gyeonggi-do (KR)

(72) Inventor: Jong-Ju Park, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 66 days.

(21) Appl. No.: 14/743,947

(22) Filed: Jun. 18, 2015

(65) Prior Publication Data
US 2016/0259585 A1    Sep. 8, 2016

(30) Foreign Application Priority Data

Mar. 6, 2015   (KR) .................. 10-2015-0031639

(51) Int. Cl.
| | | |
|---|---|---|
| *G06F 12/00* | (2006.01) |
| *G11C 16/32* | (2006.01) |
| *G11C 7/10* | (2006.01) |
| *G11C 7/20* | (2006.01) |
| *G11C 16/04* | (2006.01) |
| *G11C 16/20* | (2006.01) |
| *G06F 13/18* | (2006.01) |
| *G11C 7/22* | (2006.01) |

(52) U.S. Cl.
CPC .............. *G11C 16/32* (2013.01); *G06F 12/00* (2013.01); *G06F 13/18* (2013.01); *G11C 7/109* (2013.01); *G11C 7/20* (2013.01); *G11C 16/0483* (2013.01); *G11C 16/20* (2013.01); *G11C 7/22* (2013.01)

(58) Field of Classification Search
CPC ...................................... G06F 12/00

USPC ......................................... 711/154
See application file for complete search history.

(56) References Cited

U.S. PATENT DOCUMENTS

| | | | | |
|---|---|---|---|---|
| 2008/0022021 A1* | 1/2008 | Hsieh | ...................... | H04L 49/90 710/52 |
| 2010/0011168 A1* | 1/2010 | Ryu | ..................... | G06F 12/0804 711/135 |
| 2011/0010490 A1* | 1/2011 | Kwon | ................... | G06F 3/0611 711/103 |
| 2015/0046605 A1* | 2/2015 | Barrell | .................. | G06F 3/0659 710/5 |

FOREIGN PATENT DOCUMENTS

| | | |
|---|---|---|
| KR | 1020100022282 | 3/2010 |
| KR | 1020100064673 | 6/2010 |
| KR | 1020120098505 | 9/2012 |

* cited by examiner

*Primary Examiner* — Tuan Thai
*Assistant Examiner* — Gautam Sain
(74) *Attorney, Agent, or Firm* — IP & T Group LLP

(57) ABSTRACT

A memory system may include a command storage unit for storing maximum N commands received from a host, K memory devices each for storing maximum M commands based on the maximum N commands and performing each set operation in response to the stored maximum M commands in order of input, and a resetting unit for resetting execution sequences of the maximum N commands based on execution information regarding each of the maximum N commands and the maximum M commands in each of the K memory devices whenever the commands received from the host are stored in the command storage unit, and distributing the N commands to the K memory devices. The execution information includes a logical address, a physical address, a length, and a use time of a corresponding command.

18 Claims, 15 Drawing Sheets

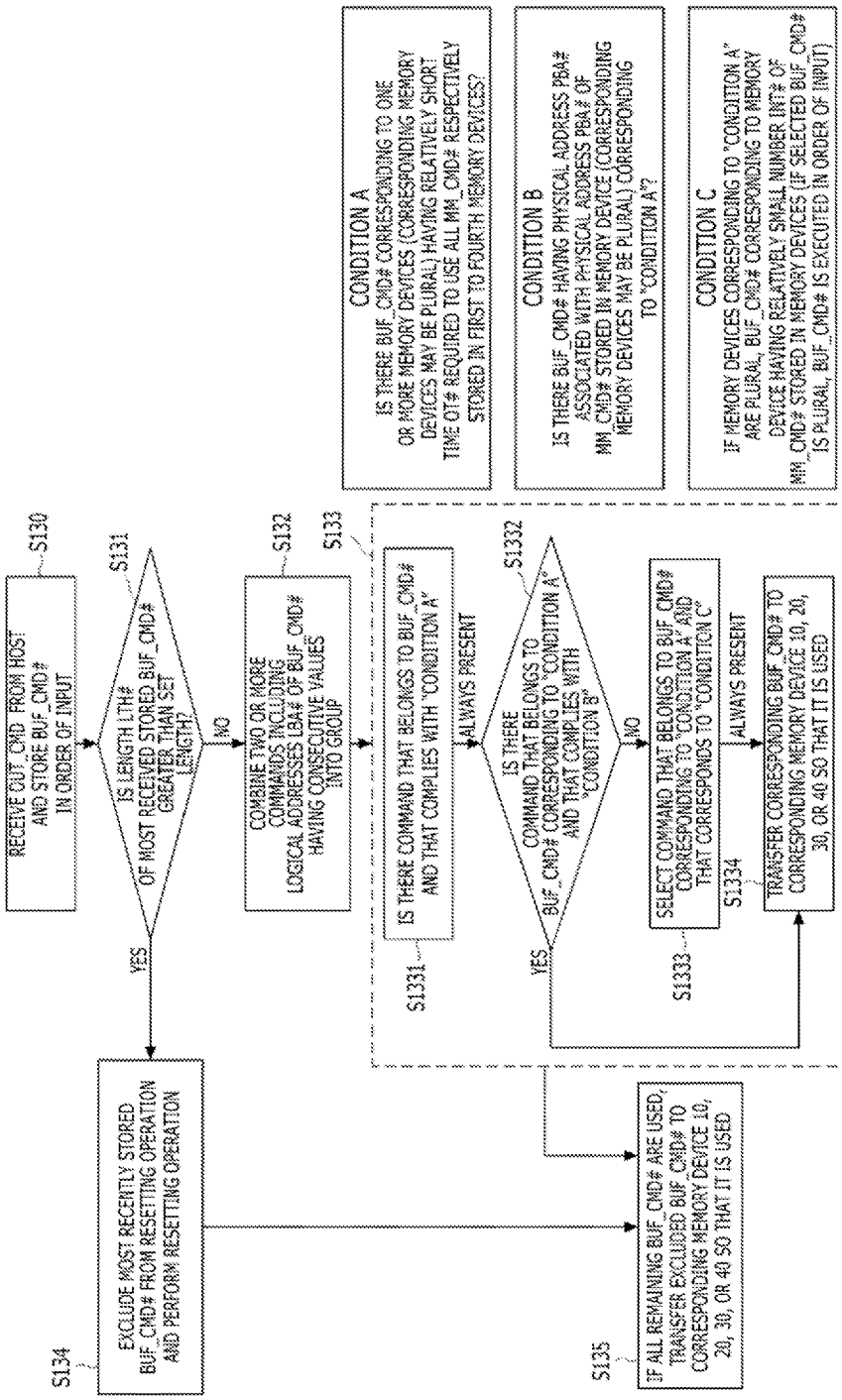

MEMORY SYSTEM AND OPERATION METHOD THEREOF

CROSS-REFERENCE TO RELATED APPLICATIONS

The present application claims priority of Korean Patent Application No. 10-2015-0031639, filed on Mar. 6, 2015, which is incorporated herein by reference in its entirety.

BACKGROUND

1. Field

Exemplary embodiments of the present invention relate to a semiconductor design technology and, more particularly, to a memory system in which execution sequences of commands sequentially received from a host are rearranged and used.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

SUMMARY

Various embodiments are directed to a memory system capable of maximizing utilization by checking execution conditions on each of a plurality of commands sequentially received from a host and then rearranging the execution sequences of the commands.

In an embodiment, a memory system may include a command storage unit suitable for storing maximum N commands received from a host; K memory devices each suitable for storing maximum M commands based on the maximum N commands and performing each set operation in response to the stored maximum M commands in order of input; and a resetting unit suitable for resetting execution sequences of the maximum N commands based on execution information regarding each of the maximum N commands and the maximum M commands in each of the K memory devices whenever the commands received from the host are stored in the command storage unit, and distributing the N commands to the K memory devices, wherein the execution information comprises a logical address, a physical address, a length, and a use time of a corresponding command.

When the length of the command that has been most recently received from the host and stored in the command storage unit is greater than a set length, the resetting unit may exclude the command from a target whose execution sequence is to be reset, sets the excluded command to an exclusion command, and resets execution sequences of remaining (N−1) commands.

After distributing all the remaining (N−1) commands to the K memory devices, the resetting unit may distribute the exclusion command to the K memory devices and distributes a command received from the host after the exclusion command.

The resetting unit may include: classifying the K memory devices into a first resetting memory device having a high first priority and a second resetting memory device having a low first priority based on a time required to use all the maximum M commands stored in each of the K memory devices, and setting commands that belong to the maximum N commands and correspond to the first resetting memory device to first resetting commands, and setting commands that belong to the maximum N commands and correspond to the second resetting memory device to second resetting commands.

The resetting unit may include: setting one or more memory devices that need a relatively short time to use all the maximum M commands stored in each of the K memory devices to the first resetting memory device, and setting remaining memory devices except for the first resetting memory device to the second resetting memory device.

The resetting unit may include: classifying the one or more first resetting commands into a third resetting command having a high second priority and a fourth resetting command having a low second priority based on a correlation between values of the physical addresses of the maximum M commands stored in each of the one or more first resetting memory devices and values of the physical addresses of the one or more first resetting commands; advancing an execution sequence of the third resetting command more than an execution sequence of the fourth resetting command; and setting the first resetting memory device corresponding to the third resetting command to a third resetting memory device, and setting the first resetting memory device corresponding to the fourth resetting command to a fourth resetting memory device.

The resetting unit may include: setting the first resetting command that corresponds to where the values of the physical addresses of the one or more first resetting commands are consecutive and have an identical value, to the third resetting command, based on the values of the physical addresses of the M commands stored in each of the one or more first resetting memory devices, and setting the first resetting command that corresponds to where the values of the physical addresses of the one or more first resetting commands are not consecutive and do not have an identical value, to the fourth resetting command.

The resetting unit may include: classifying the one or more fourth resetting commands into a fifth resetting command having a high third priority and a sixth resetting command having a low third priority based on a number of commands stored in each of the one or more fourth resetting memory devices, and advancing an execution sequence of the fifth resetting command more than an execution sequence of the sixth resetting command.

The resetting unit may include: setting a fourth resetting command that belongs to the one or more fourth resetting commands and that corresponds to the fourth resetting memory device in which a relatively small number of commands have been stored, to the fifth resetting command, and setting remaining fourth resetting commands except for the fifth resetting command to the sixth resetting command.

When the resetting unit classifies two or more commands of the maximum N commands into the sixth resetting commands, execution sequences of the two or more sixth resetting commands may be determined in order of input.

The resetting unit may combine two or more commands that belong to the maximum N commands and that have values of consecutive logical addresses into a group and simultaneously applies control of the first to the third priorities to the group.

The resetting unit may control execution sequences of the two or more commands included in the group so that a command having a value of a former logical address is first used, a command having a value of a latter logical address is later used, and the commands are always consecutively used.

When a command received from the host is stored in the command storage unit and a set number of commands or more have been stored in the command storage unit, the resetting unit may reset the execution sequences of the maximum N commands stored in the command storage unit and distributes the maximum N commands to the K memory devices.

In an embodiment, an operation method of a memory system comprising K memory devices each suitable for storing maximum M commands based on maximum N commands received from a host and performing each set operation in response to the maximum M commands in order of input, the operation method may include: sequentially storing the maximum N commands from the host in a set storage space; and resetting execution sequences of the maximum N commands stored in the set storage space based on execution information regarding each of the maximum N commands stored in the set storage space and the maximum M commands stored in each of the K memory devices whenever the commands received from the host are stored in the set storage space, and distributing the reset maximum N commands to the K memory devices, wherein the execution information comprises a logical address, a physical address, a length, and a use time of a corresponding command.

The resetting of the execution sequences of the maximum N commands and the distributing of the reset maximum N commands to the K memory devices may include: setting the command most recently received from the host and stored in the set storage space to an exclusion command when the length of the most recently stored command is greater than a set length; distributing remaining (N−1) commands that are stored in the set storage space prior to the exclusion command to the K memory devices; distributing the exclusion command to the K memory devices; and distributing the command that is received from the host to the K memory devices after the exclusion command.

The resetting of the execution sequences of the maximum N commands and the distributing of the reset maximum N commands to the K memory devices may include: setting a memory device having a relatively short time required to use all the maximum M commands stored in each of the K memory devices to a first resetting memory device having a high first priority, and setting remaining memory devices except for the first resetting memory device to a second resetting memory device having a low first priority; and setting the command that belongs to the maximum N commands stored in the set storage space and that corresponds to the first resetting memory device to a first resetting command, and setting the command that belongs to the maximum N commands stored in the set storage space and that corresponds to the second resetting memory device to a second resetting command.

The resetting of the execution sequences of the maximum N commands and the distributing of the reset maximum N commands to the K memory devices may include: setting the first resetting command that corresponds to when values of physical addresses of the one or more first resetting commands are consecutive and have an identical value, to a third resetting command having a high second priority, and setting the first resetting command that corresponds to when the values of the physical addresses of the one or more first resetting commands are not consecutive and do not have an identical value, to a fourth resetting command having a low second priority, based on the values of the physical addresses of the M commands stored in each of the one or more first resetting memory devices; advancing an execution sequence of the third resetting command more than an execution sequence of the fourth resetting command; and setting the first resetting memory device corresponding to the third resetting command to a third resetting memory device, and setting the first resetting memory device corresponding to the fourth resetting command to a fourth resetting memory device.

The resetting of the execution sequences of the maximum N commands and the distributing of the reset maximum N commands to the K memory devices may include: setting the fourth resetting command that belongs to the one or more fourth resetting memory devices and stores the command having a relatively small number of commands stored in each of the one or more fourth resetting memory devices, to a fifth resetting command having a high third priority, and setting remaining fourth resetting commands except for the fifth resetting command to sixth resetting commands, and advancing an execution sequence of the fifth resetting command more than an execution sequence of the sixth resetting command.

The resetting of the execution sequences of the maximum N commands and the distributing of the reset maximum N commands to the K memory devices, when one or more of the maximum N commands stored in the set storage space are classified into the sixth resetting commands, execution sequences of the two or more sixth resetting commands may be determined in order of input.

Two or more commands that belong to the maximum N commands stored in the set storage space and that have values of consecutive logical addresses are formed into a group, and control of the first to third priorities may be simultaneously applied to the group.

BRIEF DESCRIPTION OF THE DRAWINGS

FIG. 13 is a flowchart explaining an operation method of the memory system of FIG. 12 in accordance with an embodiment of the present invention.

DETAILED DESCRIPTION

Figure 1:
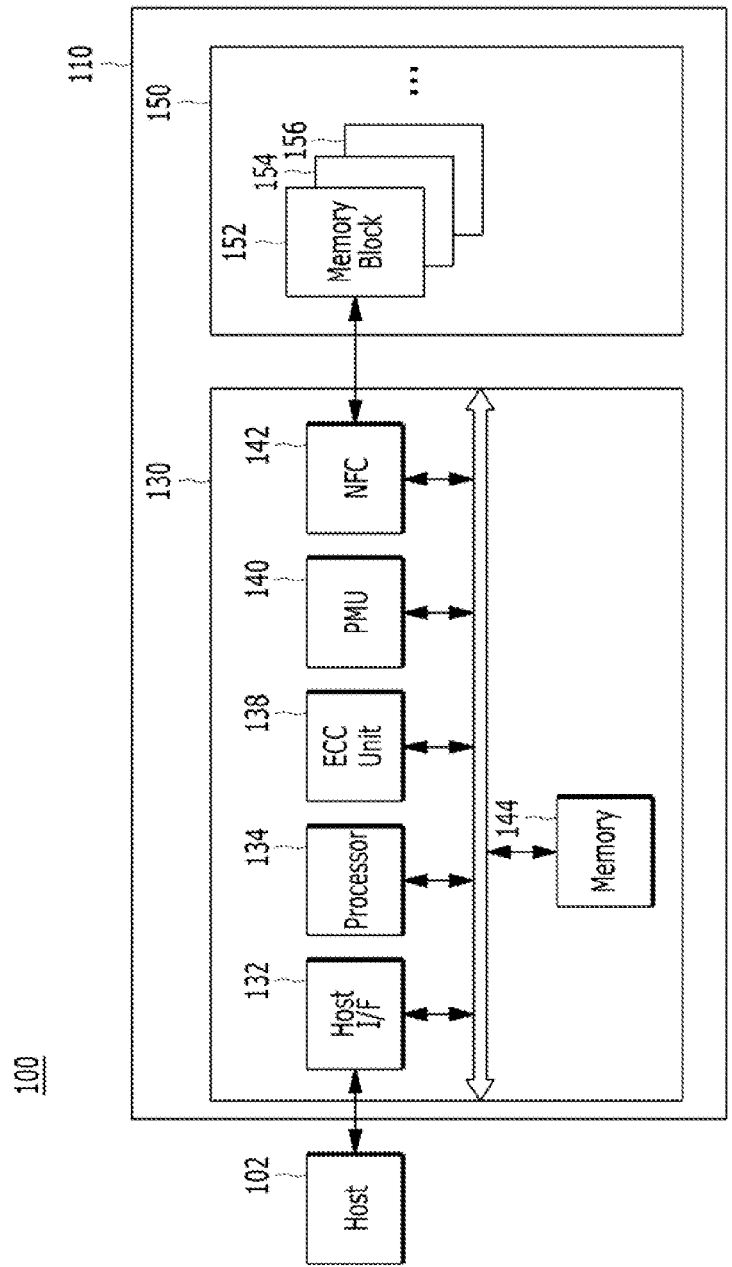
FIG. 1 is a diagram illustrating a data processing system including a memory system in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram schematically illustrating a data processing system including a memory system in accordance with an embodiment.

Referring to FIG. 1, a data processing system 100 includes a host 102 and a memory system 110.

The host 102 includes, for example, a portable electronic device such as a mobile phone, an MP3 player and a laptop computer or an electronic device such as a desktop computer, a game player, a TV and a projector.

The memory system 110 operates in response to a request from the host 102 and, in particular, stores data to be accessed by the host 102. In other words, the memory system 110 may be used as a main memory device or an auxiliary memory device of the host 102. The memory system 110 may be implemented with any one of various kinds of storage devices, depending on the protocol of a host interface to be electrically coupled with the host 102. For example, the memory system 110 may be implemented with any one of various kinds of storage devices such as a solid state drive, a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card (SMC), a memory stick, and so forth.

The memory system 110 may be implemented with a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), an ferroelectric random access memory (FRAM), a phase change RAM (PRAM), a magnetoresistive RAM (MRAM) and a resistive RAM (RRAM).

The memory system 110 includes a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. For example, the controller 130 and the memory card 150 may be integrated into one semiconductor device and configure a memory card such as a Personal Computer Memory Card International Association (PCM-CIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted, and, in particular, stores the data provided from the host 102 during a write operation, and provides stored data to the host 102 during a read operation. The memory device 150 includes a plurality of memory blocks 152, 154 and 156. Each of the memory blocks 152, 154 and 156 includes a plurality of pages. Each of the pages includes a plurality of memory cells to which a plurality of word lines (WL) are electrically coupled. The memory device 150 may be a nonvolatile memory device, for example, a flash memory. The flash memory may have a 3D stack structure. Since the structure of the memory device 150 and the 3D stack structure of the memory device 150 will be described later in detail with reference to FIGS. 2 to 11, detailed descriptions thereof will be omitted herein.

The controller 130 of the memory system 110 controls the memory device 150 in response to a request from the host 102. For example, the controller 130 provides the data read from the memory device 150, to the host 102, and stores the data provided from the host 102, in the memory device 150. To this end, the controller 130 controls overall operations of the memory device 150, such as read, write, program and erase operations.

In detail, the controller 130 includes a host interface unit 132, a processor 134, an error correction code (ECC) unit 138, a power management unit 140, a NAND flash controller 142, and a memory 144.

The host interface unit 132 processes commands and data provided from the host 102, and may be configured to communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 detects and corrects errors in the data read from the memory device 150 during the read operation. That is, after performing an error correction decoding operation on the data read from the memory device 150, the ECC unit 138 may determine whether the error correction decoding operation has succeeded, output an indication signal based on a determination result, and correct an error bit of the read data based on a parity bit generated by an ECC encoding process. The ECC unit 138 may not correct error bits if the number of error bits is equal to or greater than a threshold number of correctable error bits, and may output an error correction fail signal if it is incapable of correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 provides and manages power for the controller 130, that is, power for the component elements included in the controller 130.

The NFC 142 serves as a memory interface between the controller 130 and the memory device 150 to allow the controller 130 to control the memory device 150 in response to a request from the host 102. The NFC 142 generates control signals for the memory device 150 and processes data under the control of the processor 134, when the memory device 150 is a flash memory and, in particular, when the memory device 150 is a NAND flash memory.

The memory 144 serves as a working memory of the memory system 110 and the controller 130, stores data for driving the memory system 110 and the controller 130. In detail, when the controller 130 controls the memory device 150 in response to a request from the host 102, for example, when the controller 130 provides the data read from the memory device 150 to the host 102, and stores the data provided from the host 102 in the memory device 150, and, to this end when the controller 130 controls the operations of the memory device 150, such as read, write, program and erase operations, the memory 144 stores data needed to allow such operations to be performed by the memory system 110, that is, between the controller 130 and the memory device 150.

The memory 144 may be implemented with a volatile memory. For example, the memory 144 may be implemented with a static random access memory (SRAM) or a dynamic random access memory (DRAM). As described above, the memory 144 stores data needed to perform the read and write operations between the host 102 and the memory device 150. To store the data, the memory 144 includes a program memory, a data memory, a write buffer, a read buffer, a map buffer, and so forth.

The processor 134 controls general operations of the memory system 110, and controls a write operation or a read operation for the memory device 150, in response to a write request or a read request from the host 102. The processor 134 drives firmware, which is referred to as a flash translation layer (FTL), to control the general operations of the memory system 110. The processor 134 may be implemented with a microprocessor or a central processing unit (CPU).

A management unit (not shown) for performing bad management, for example, bad block management, of the memory device 150 is included in the processor 134. The management unit checks a bad block among the plurality of memory blocks included in the memory device 150, and performs the bad block management for processing a checked bad block as bad. If the memory device 150 is a flash memory, for example, a NAND flash memory, a program fail may occur during the write operation, for example, during the program operation, due to the characteristics of a NAND logic function. The bad management, that is, the bad block management refers to processing a memory block in which a program failure has occurred, as bad, and write, that is, program, program-failed data in a new memory block. Also, when the memory device 150 has a 3D stack structure, since the utilization efficiency of the memory device 150 and the reliability of the memory system 100 markedly deteriorate when processing a corresponding memory block as a bad block due to a program fail, reliable bad block management is required. Hereinbelow, the memory device in the memory system in accordance with the embodiment will be described in detail with reference to FIGS. 2 to 11.

Figure 2:
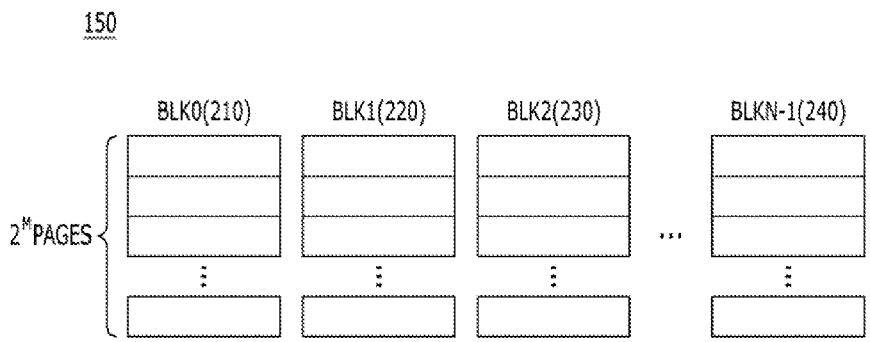
FIG. 2 is a diagram illustrating a memory device in the memory system shown in FIG. 1.

FIG. 2 is a diagram schematically illustrating the memory device 150 in the memory system 110 of FIG. 1 in accordance with an embodiment.

Referring to FIG. 2, the memory device 150 includes a plurality of memory blocks, for example, a zeroth block (BLOCK0) 210, a first block (BLOCK1) 220, a second block (BLOCK2) 230 and an N-1$^{th}$ block (BLOCKN-1) 240. Each of the blocks 210, 220, 230 and 240 includes a plurality of pages, for example, $2^M$ number of pages ($2^M$PAGES). While it is described for the sake of convenience that each of the plurality of memory blocks includes $2^M$ number of pages, it is to be noted that each of the plurality of memory blocks may include M number of pages. Each of the pages includes a plurality of memory cells to which a plurality of word lines (WL) are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block includes a plurality of pages which are implemented with memory cells each capable of storing 1-bit data, and may have high data calculation performance and superior durability. The MLC memory block includes a plurality of pages which are implemented with memory cells each capable of storing multi-bit data, for example, two or more-bit data, and may have a data storage space larger than the SLC memory block, that is, may be highly integrated. An MLC memory block including a plurality of pages which are implemented with memory cells each capable of storing 3-bit data may be defined as a triple level cell (TLC) memory block.

Each of the memory blocks 210, 220, 230 and 240 stores the data provided from the host device 102 of FIG. 1 during a write operation, and provides stored data to the host 102 during a read operation.

Figure 3:
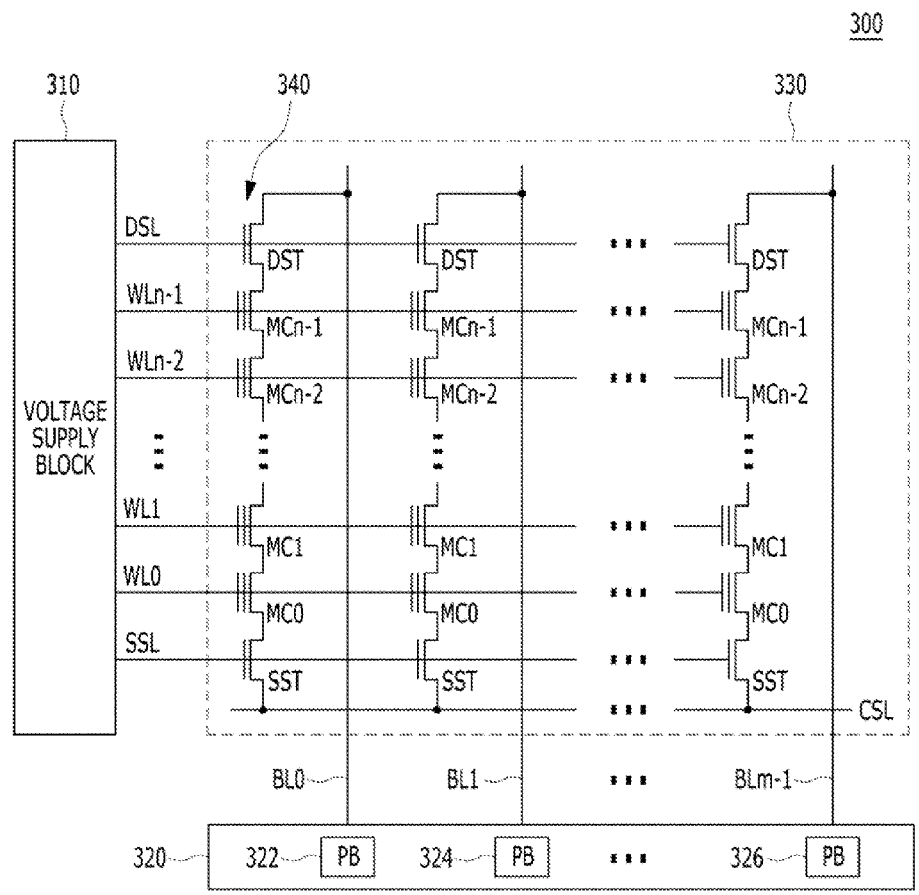
FIG. 3 is a circuit diagram illustrating a memory block in a memory device in accordance with an embodiment.

FIG. 3 is a circuit diagram schematically illustrating a memory block in the memory device of FIG. 2 in accordance with an embodiment.

Referring to FIG. 3, a memory block 330 of a memory device 300 may include a plurality of cell strings 340 which are electrically coupled to bit lines BL0 to BLm-1, respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST and SST. The respective memory cells MC0 to MCn-1 may be configured by multi-level cells (MLC) each of which stores data information of a plurality of bits. The strings 340 may be electrically coupled to the corresponding bit lines BL0 to BLm-1, respectively.

While FIG. 3 shows, as an example, the memory block 330 which is configured by NAND flash memory cells, it is to be noted that the memory block 330 of the memory device 300 in accordance with the embodiment is not limited to a NAND flash memory and may be implemented with a NOR flash memory, a hybrid flash memory in which at least two kinds of memory cells are combined, or an one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 300 may provide word line voltages, for example, a program voltage, a read voltage and a pass voltage, to be supplied to respective word lines according to an operation mode and voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 300 is controlled by the control circuit, and may serve as a sense amplifier or a write driver according to an operation mode. For example, during a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326.

Hereinbelow, detailed descriptions will be made with reference to FIGS. 4 to 11, for the memory device 150 in the memory system 110 in accordance with the embodiment, when the memory device is implemented with a three-dimensional (3D) nonvolatile memory device.

Figure 4:
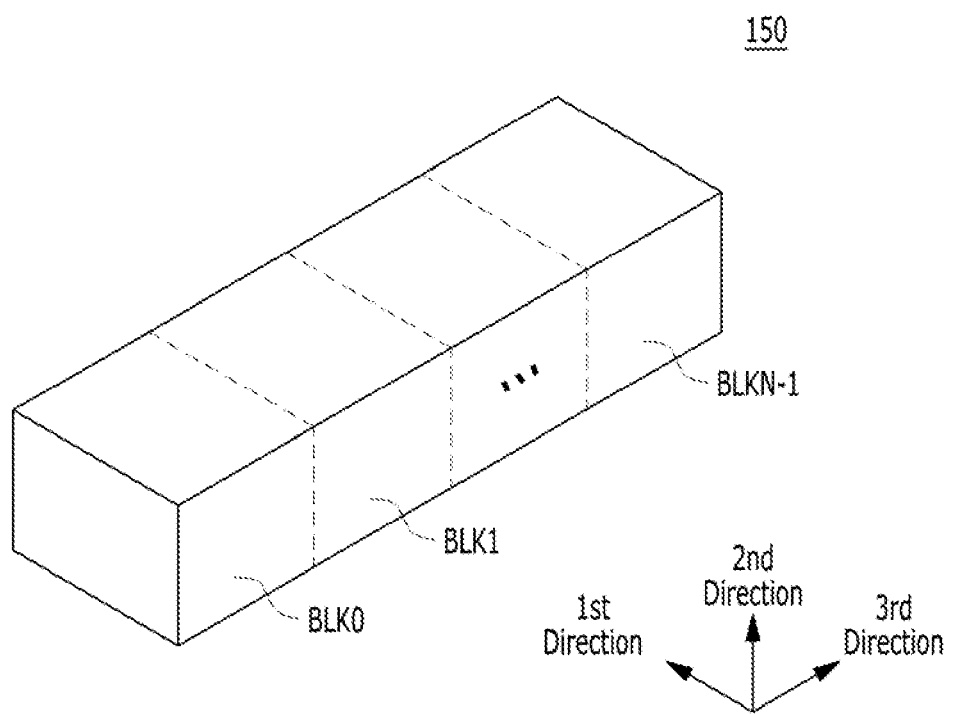
FIGS. 4 to 11 are diagrams schematically illustrating the memory device shown in FIG. 2.

FIG. 4 is a block diagram illustrating the memory block of the memory device 150 shown in FIG. 2 in accordance with an embodiment.

Referring to FIG. 4, the memory device 150 may include a plurality of memory blocks BLK0 to BLKN−1, and each of the memory blocks BLK0 to BLKN−1 may be realized in a three-dimensional (3D) structure or a vertical structure. For example, the respective memory blocks BLK0 to BLKN−1 may include structures which extend in first to third directions, for example, an x-axis direction, a y-axis direction and a z-axis direction.

The respective memory blocks BLK0 to BLKN−1 may include a plurality of NAND strings NS which extend in the second direction. The plurality of NAND strings NS may be provided in the first direction and the third direction. Each NAND string NS may be electrically coupled to a bit line BL, at least one string select line SSL, at least one ground select line GSL, a plurality of word lines WL, at least one dummy word line DWL, and a common source line CSL. Namely, the respective memory blocks BLK0 to BLKN−1 may be electrically coupled to a plurality of bit lines BL, a plurality of string select lines SSL, a plurality of ground select lines GSL, a plurality of word lines WL, a plurality of dummy word lines DWL, and a plurality of common source lines CSL.

Figure 5:
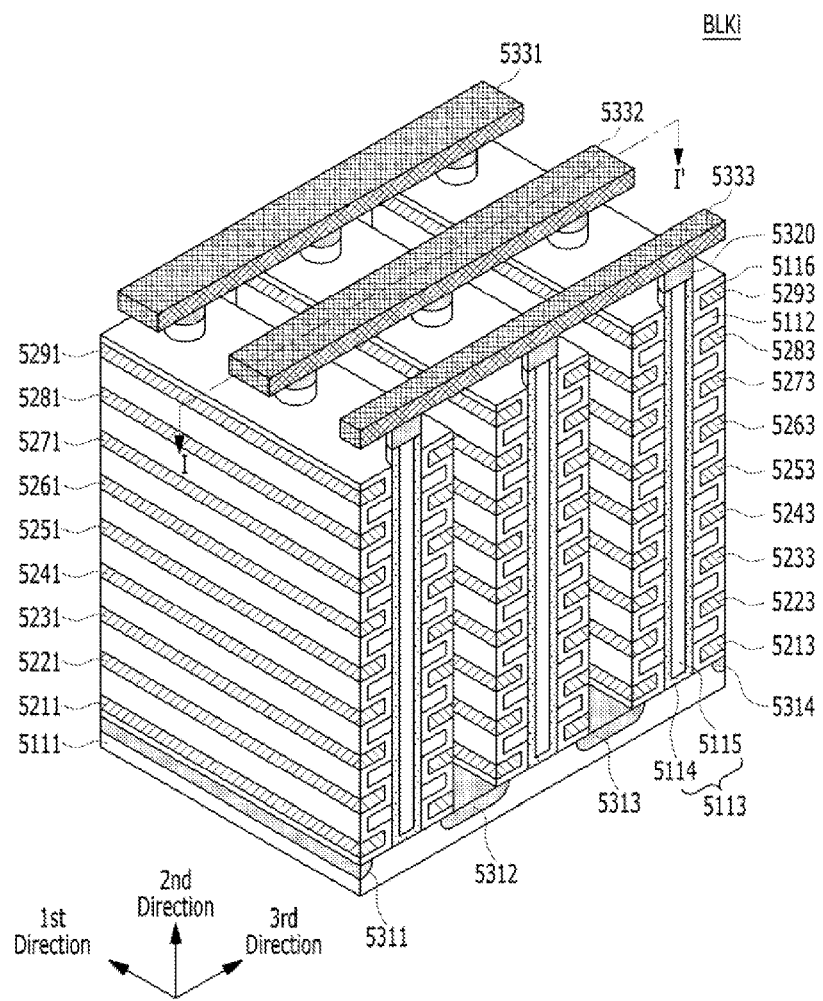
Figure 6:
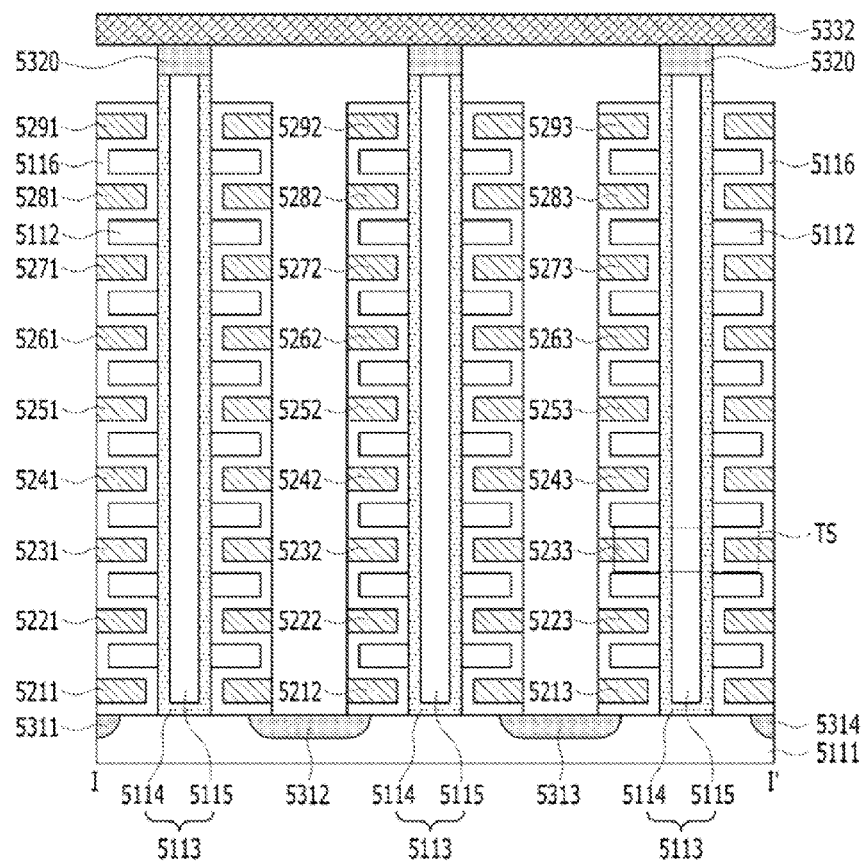

FIG. 5 is a perspective view of a certain memory block of the plural memory blocks BLK0 to BLKN−1 shown in FIG. 4. FIG. 6 is a cross-sectional view taken along a line I-I' of the memory block BLKi shown in FIG. 5.

Referring to FIGS. 5 and 6, the certain memory block BLKi among the plurality of memory blocks of the memory device 150 may include a structure which extends in the first to third directions.

A substrate 5111 may be provided. For example, the substrate 5111 may include a silicon material doped with a first type impurity. For example, the substrate 5111 may include a silicon material doped with a p-type impurity or may be a p-type well, for example, a pocket p-well, and include an n-type well which surrounds the p-type well. While it is assumed in the embodiment for the sake of convenience in explanation that the substrate 5111 is p-type silicon, it is to be noted that the substrate 5111 is not limited to the p-type silicon.

A plurality of doping regions 5311, 5312, 5313 and 5314 which extend in the first direction may be provided on the substrate 5111. For example, the plurality of doping regions 5311, 5312, 5313 and 5314 may be a second type (i.e. doped with a second type of impurity), which is different from the substrate 5111. For example, the plurality of doping regions 5311, 5312, 5313 and 5314 may be doped with an n-type impurity. While it is assumed in the embodiment for the sake of convenience in explanation that first to fourth doping regions 5311, 5312, 5313 and 5314 are the n-type, it is to be noted that the first to fourth doping regions 5311, 5312, 5313 and 5314 are not limited to the n-type.

In the region on the substrate 5111 between the first and second doping regions 5311 and 5312, a plurality of dielectric materials 5112 which extend in the first direction may be sequentially provided in the second direction. For example, the plurality of dielectric materials 5112 and the substrate 5111 may be separated from one another by a predetermined distance in the second direction. For example, the plurality of dielectric materials 5112 may be separated from one another by the predetermined distance in the second direction. For example, the dielectric materials 5112 may include a dielectric material such as silicon oxide.

In the region on the substrate 5111 between the first and second doping regions 5311 and 5312, a plurality of pillars 5113 which are sequentially disposed in the first direction and pass through the dielectric materials 5112 in the second direction may be provided. For example, the pillars 5113 may pass through the dielectric materials 5112 and may be electrically coupled with the substrate 5111. For example, each pillar 5113 may be configured by a plurality of materials. For example, a surface layer 5114 of each pillar 5113 may include a silicon material doped into the first type (i.e. doped with a first type of impurity). For example, the surface layer 5114 of each pillar 5113 may include a silicon material doped with the same type impurity as the substrate 5111. While it is assumed in the embodiment for the sake of convenience in explanation that the surface layer 5114 of each pillar 5113 includes p-type silicon, the surface layer 5114 of each pillar 5113 is not limited to the p-type silicon.

An inner layer 5115 of each pillar 5113 may be formed of a dielectric material. For example, the inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. For example, the thickness of the dielectric layer 5116 may be smaller than half of the distance between the dielectric materials 5112. In other words, a region in which a material other than the dielectric material 5112 and the dielectric layer 5116 may be disposed, may be provided between (i) the dielectric layer 5116 provided on the bottom surface of a first dielectric material of the dielectric materials 5112 and (ii) the dielectric layer 5116 provided on the top surface of a second dielectric material of the dielectric materials 5112. The dielectric materials 5112 lie below the first dielectric material.

In the region between the first and second doping regions 5311 and 5312, conductive materials 5211, 5221, 5231, 5241, 5251, 5261, 5271, 5281 and 5291 may be provided on the exposed surface of the dielectric layer 5116. For example, the conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of a certain dielectric material of the dielectric materials 5112 and (ii) the dielectric layer 5116 disposed over the bottom surface of another dielectric material of the dielectric materials 5112, which is disposed over the certain dielectric material 5112. For example, the plurality of conductive materials 5221, 5231, 5241, 5251, 5261, 5271 and 5281 which extend in the first direction may be provided between the dielectric materials 5112. The conductive material 5291 which extends in the first direction may be provided over the uppermost dielectric material 5112. For example, the conductive materials 5211, 5221, 5231, 5241, 5251, 5261, 5271, 5281 and 5291 which extend in the first direction may be a metallic material. For example, the conductive materials 5211, 5221, 5231, 5241, 5251, 5261, 5271, 5281 and 5291 which extend in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided on the exposed surfaces of the plurality of dielectric materials 5112 and the plurality of pillars 5113, and the plurality of conductive materials 5212, 5222, 5232, 5242, 5252, 5262, 5272, 5282 and 5292 which extend in the first direction may be provided.

In the region between the third and fourth doping regions 5313 and 5314, the same structures as the structures between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided on the exposed surfaces of the plurality of dielectric materials 5112 and the plurality of pillars 5113, and the plurality of conductive materials 5213, 5223, 5233, 5243, 5253, 5263, 5273, 5283 and 5293 which extend in the first direction may be provided.

Drains 5320 may be respectively provided on the plurality of pillars 5113. For example, the drains 5320 may be silicon materials doped with the second type impurity. For example, the drains 5320 may be silicon materials doped into the n-type (i.e. doped with n-type impurities). While it is assumed in the embodiment for the sake of convenience in explanation that the drains 5320 include n-type silicon, it is to be noted that the drains 5320 are not limited to the n-type silicon. For example, the width of each drain 5320 may be larger than the width of each corresponding pillar 5113. For example, each drain 5320 may be provided in the shape of a pad on the top surface of each corresponding pillar 5113.

Conductive materials 5331, 5332 and 5333 which extend in the third direction may be provided on the drains 5320. The conductive materials 5331, 5332 and 5333 may be sequentially disposed in the first direction. The respective conductive materials 5331, 5332 and 5333 may be electrically coupled with the drains 5320 of corresponding regions. For example, the drains 5320 and the conductive materials 5331, 5332 and 5333 which extend in the third direction may be electrically coupled through contact plugs. For example, the conductive materials 5331, 5332 and 5333 which extend in the third direction may be a metallic material. For example, the conductive materials 5331, 5332 and 5333 which extend in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. For example, the respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
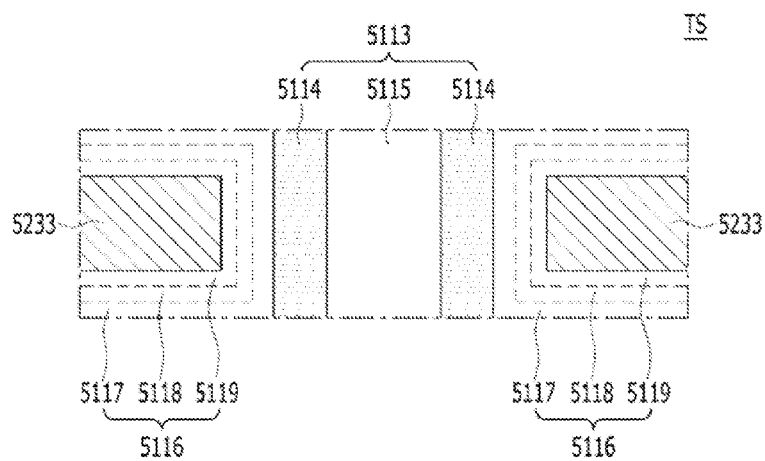

FIG. 7 is a cross-sectional view of the transistor structure TS shown in FIG. 6.

Referring to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. For example, the second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. For example, the third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117, 5118 and 5119 may form an oxide-nitride-oxide (ONO) structure. In the embodiment, for the sake of convenience in explanation, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a string select transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. In other words, the gates or the control gates may extend in the first direction and form word lines and at least two select lines, for example, at least one string select line SSL and at least one ground select line GSL.

The conductive materials 5331, 5332 and 5333 which extend in the third direction may be electrically coupled to ends of the NAND strings NS. For example, the conductive materials 5331, 5332 and 5333 which extend in the third direction may serve as bit lines BL. That is, in one memory block BLKi, the plurality of NAND strings NS may be electrically coupled to one bit line BL.

The second type doping regions 5311, 5312, 5313 and 5314 which extend in the first direction may be provided to the other ends of the NAND strings NS. The second type doping regions 5311, 5312, 5313 and 5314 which extend in the first direction may serve as common source lines CSL.

Namely, the memory block BLKi includes a plurality of NAND strings NS which extend in a direction perpendicular to the substrate 5111, e.g., the second direction, and may serve as a NAND flash memory block, for example, of a charge capturing type memory, in which a plurality of NAND strings NS are electrically coupled to one bit line BL.

While it is illustrated in FIGS. 5 to 7 that the conductive materials 5211 to 5291, 5212 to 5292 and 5213 to 5293 which extend in the first direction are provided in 9 layers, it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 16 layers or a different number of layers. In other words, in one NAND string NS, the number of transistors may be 8, 16 or more.

While it is illustrated in FIGS. 5 to 7 that 3 NAND strings NS are electrically coupled to one bit line BL, it is to be noted that the embodiment is not limited to the fact that 3 NAND strings NS are electrically coupled to one bit line BL. For example, in the memory block BLKi, m number of NAND strings NS may be electrically coupled to one bit line BL, m being a positive integer. According to the number of NAND strings NS which are electrically coupled to one bit line BL, the number of conductive materials 5211 to 5291, 5212 to 5292 and 5213 to 5293 which extend in the first direction and the number of common source lines 5311, 5312, 5313 and 5314 may be controlled as well.

Further, while it is illustrated in FIGS. 5 to 7 that 3 NAND strings NS are electrically coupled to one conductive material which extends in the first direction, it is to be noted that the embodiment is not limited to the fact that 3 NAND strings NS are electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331, 5332 and 5333 may be controlled as well.

Figure 8:
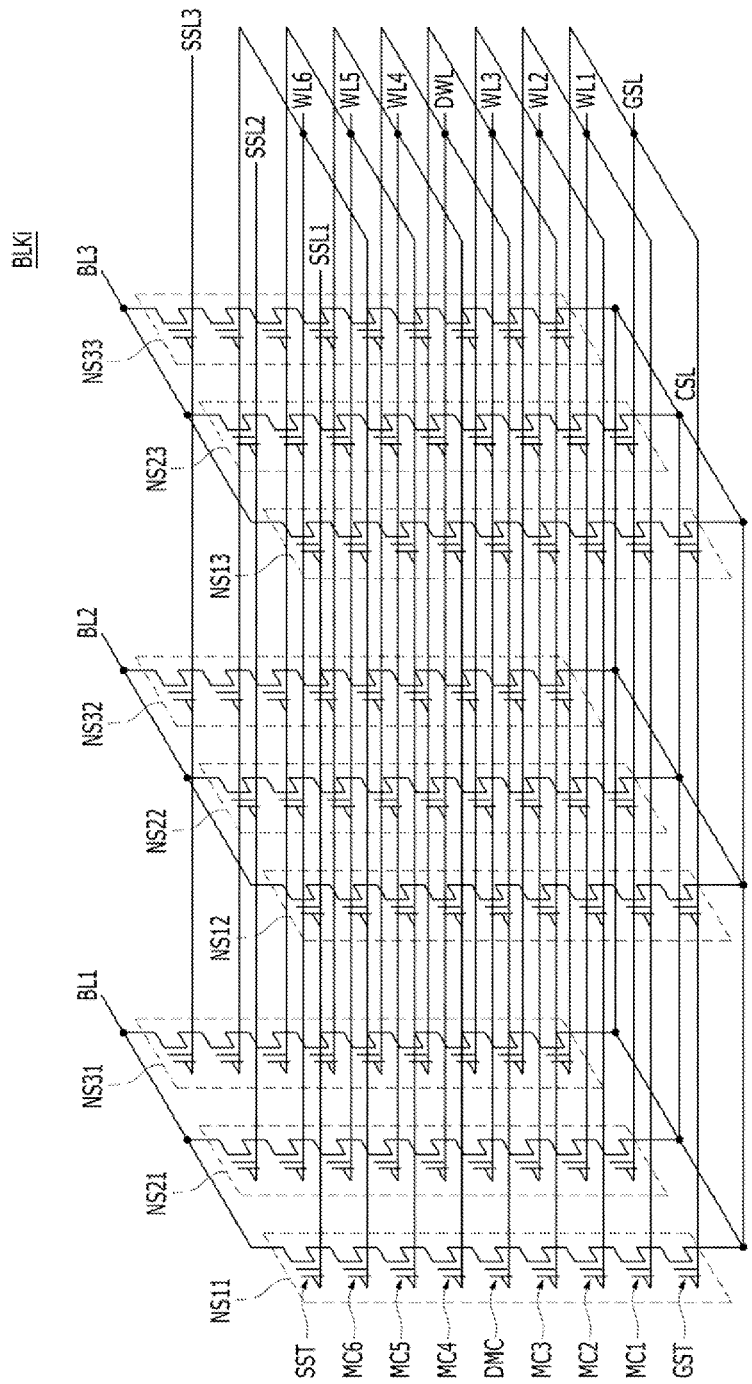

FIG. 8 is an equivalent circuit diagram illustrating the memory block BLKi having a first structure described with reference to FIGS. 5 to 7.

Referring to FIG. 8, in the certain block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A string select transistor SST of each NAND string NS may be electrically coupled to a corresponding bit line BL. A ground select transistor GST of each NAND string NS may be electrically coupled to the common source line CSL. Memory cells MC may be provided between the string select transistor SST and the ground select transistor GST of each NAND string NS.

In the embodiment, for the sake of convenience in explanation, it will be described as an example that NAND strings NS may be defined by the unit of row and column and NAND strings NS which are electrically coupled in common to one bit line may form one column. For example, the NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one string select line SSL may form one row. For example, the NAND strings NS11 to NS13 which are electrically coupled to a first string select line SSL1 may form a first row, the NAND strings NS21 to NS23 which are electrically coupled to a second string select line SSL2 may form a second row, and the NAND strings NS31 to NS33 which are electrically coupled to a third string select line SSL3 may form a third row.

In each NAND string NS, a height may be defined. For example, in each NAND string NS, the height of a memory cell MC1 adjacent to the ground select transistor GST is a value '1'. In each NAND string NS, the height of a memory cell may increase as the memory cell gate is closer to the string select transistor SST when measured from the substrate 5111. In each NAND string NS, the height of a memory cell MC6 adjacent to the string select transistor SST is 7.

The string select transistors SST of the NAND strings NS in the same row may share the string select line SSL. The string select transistors SST of the NAND strings NS in different rows may be electrically coupled to the different string select lines SSL1, SSL2 and SSL3.

The memory cells at the same height in the NAND strings NS in the same row may share the word line WL. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. Namely, at the same height or level, the dummy word lines DWL electrically coupled to the dummy memory cells DMC of the NAND strings NS in different rows may be electrically coupled.

For example, the word lines WL or the dummy word lines DWL located at the same level or height or layer may be electrically coupled with one another at layers where the conductive materials 5211 to 5291, 5212 to 5292 and 5213 to 5293 which extend in the first direction are provided. For example, the conductive materials 5211 to 5291, 5212 to 5292 and 5213 to 5293 which extend in the first direction may be electrically coupled in common to upper layers through contacts. At the upper layers, the conductive materials 5211 to 5291, 5212 to 5292 and 5213 to 5293 which extend in the first direction may be electrically coupled in common with one another. In other words, the ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings NS. For example, on the active regions over the substrate 5111, the first to fourth doping regions 5311, 5312, 5313 and 5314 may be electrically coupled with one another. For example, the first to fourth doping regions 5311, 5312, 5313 and 5314 may be electrically coupled to an upper layer through contacts, and at the upper layer, the first to fourth doping regions 5311, 5312, 5313 and 5314 may be electrically coupled.

Namely, as shown in FIG. 8, the word lines WL of the same height or level may be electrically coupled. Accordingly, when a certain word line WL at a specific height is selected, all NAND strings NS which are electrically coupled to the certain word line WL may be selected. The NAND strings NS in different rows may be electrically coupled to different string select lines SSL. Accordingly, among the NAND strings NS electrically coupled to the same word line WL, by selecting one of the string select lines SSL1 to SSL3, the NAND strings NS in the unselected rows may be electrically isolated from the bit lines BL1 to BL3. In other words, by selecting one of the string select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC is provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the string select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the string select transistor SST may be referred to as an upper memory cell group.

Hereinbelow, detailed descriptions will be made with reference to FIGS. 9 to 11, for where the memory device in the memory system in accordance with an embodiment is implemented with a three-dimensional (3D) nonvolatile memory device of a structure different from the first structure.

Figure 9:
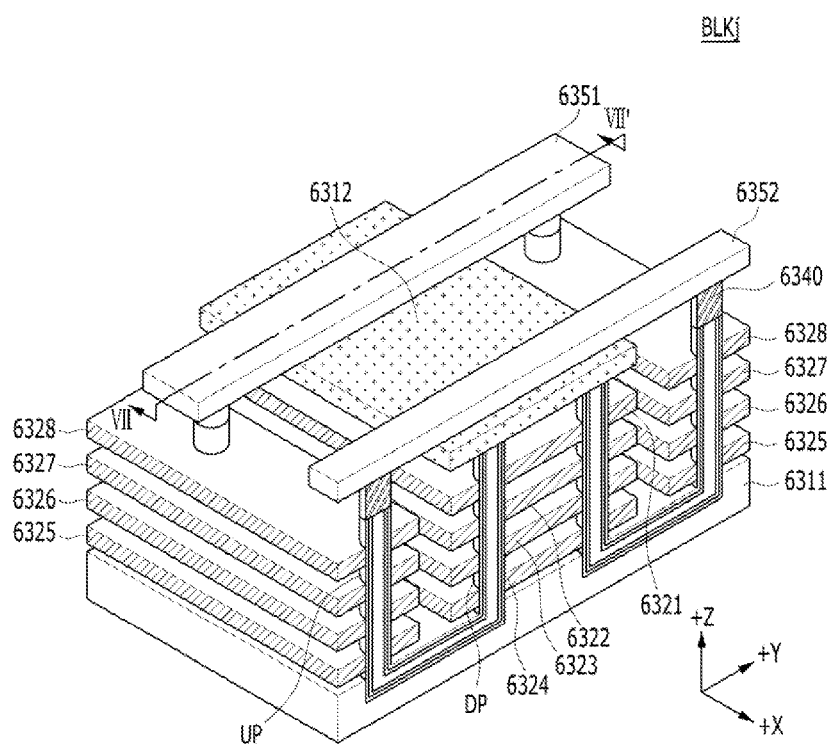
Figure 10:
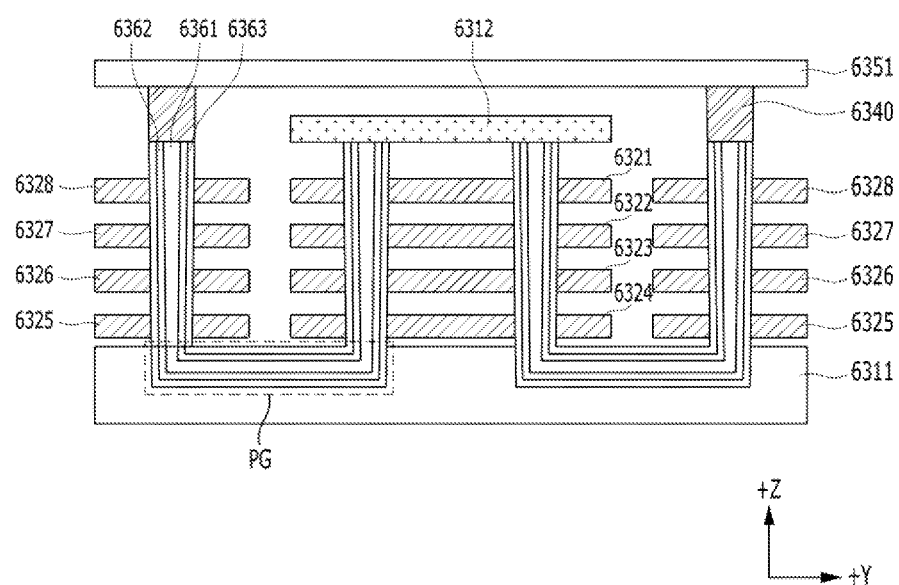

FIG. 9 is a perspective view schematically illustrating structures where the memory device in accordance with the embodiment is implemented with a three-dimensional (3D) nonvolatile memory device of a second structure different from the first structure described above with reference to FIGS. 5 to 8 and showing a certain memory block BLKj having the second structure in the plurality of memory blocks of FIG. 4, and FIG. 10 is a cross-sectional view illustrating the certain memory block BLKj taken along the line VII-VII' of FIG. 9.

Referring to FIGS. 9 and 10, the certain memory block BLKj among the plurality of memory blocks of the memory device 150 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. While it is assumed in the embodiment for the sake of convenience in explanation that the substrate 6311 is p-type silicon, it is to be noted that the substrate 6311 is not limited to the p-type silicon.

First to fourth conductive materials 6321, 6322, 6323 and 6324 which extend in the x-axis direction and the y-axis direction are provided on the substrate 6311. The first to fourth conductive materials 6321, 6322, 6323 and 6324 are separated by a predetermined distance in the z-axis direction.

Fifth to eighth conductive materials 6325, 6326, 6327 and 6328 which extend in the x-axis direction and the y-axis direction are provided on the substrate 6311. The fifth to eighth conductive materials 6325, 6326, 6327 and 6328 are separated by the predetermined distance in the z-axis direction. The fifth to eighth conductive materials 6325, 6326, 6327 and 6328 are separated from the first to fourth conductive materials 6321, 6322, 6323 and 6324 in the y-axis direction.

A plurality of lower pillars DP which pass through the first to fourth conductive materials 6321, 6322, 6323 and 6324 are provided. Each lower pillar DP extends in the z-axis direction. Also, a plurality of upper pillars UP which pass through the fifth to eighth conductive materials 6325, 6326, 6327 and 6328 are provided. Each upper pillar UP extends in the z-axis direction.

Each of the lower pillars DP and the upper pillars UP includes an internal material 6361, an intermediate layer 6362, and a surface layer 6363. The intermediate layer 6362 serves as a channel of the cell transistor. The surface layer 6363 includes a blocking dielectric layer, a charge storing layer and a tunneling dielectric layer.

The lower pillar DP and the upper pillar UP are electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction is provided on the lower pillars DP. For example, the doping material 6312 of the second type may include an n-type silicon material. The doping material 6312 of the second type serves as a common source line CSL.

Drains 6340 are provided on the upper pillars UP. For example, the drains 6340 may include an n-type silicon material. First and second upper conductive materials 6351 and 6352 which extend in the y-axis direction are provided on the drains 6340.

The first and second upper conductive materials 6351 and 6352 are separated in the x-axis direction. For example, the first and second upper conductive materials 6351 and 6352 may be formed of a metal. For instance, the first and second upper conductive materials 6351 and 6352 and the drains 6340 may be electrically coupled with each other through contact plugs. The first and second upper conductive materials 6351 and 6352 respectively serve as first and second bit lines BL1 and BL2.

The first conductive material 6321 serves as a source select line SSL, the second conductive material 6322 serves as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 serves as a second dummy word line DWL2, and the eighth conductive material 6328 serves as a drain select line DSL.

The lower pillar DP and the first to fourth conductive materials 6321, 6322, 6323 and 6324 adjacent to the lower pillar DP form a lower string. The upper pillar UP and the fifth to eighth conductive materials 6325, 6326, 6327 and 6328 adjacent to the upper pillar UP form an upper string. The lower string and the upper string are electrically coupled through the pipe gate PG. One end of the lower string is electrically coupled to the doping material 6312 of the second type which serves as the common source line CSL. One end of the upper string is electrically coupled to a corresponding bit line through the drain 6340. One lower string and one upper string form one cell string which is electrically coupled between the doping material 6312 of the second type serving as the common source line CSL and a corresponding one of the upper conductive material layers 6351 and 6352 serving as the bit line BL.

That is, the lower string includes a source select transistor SST, the first dummy memory cell DMC1, and the first and second main memory cells MMC1 and MMC2. The upper string includes the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
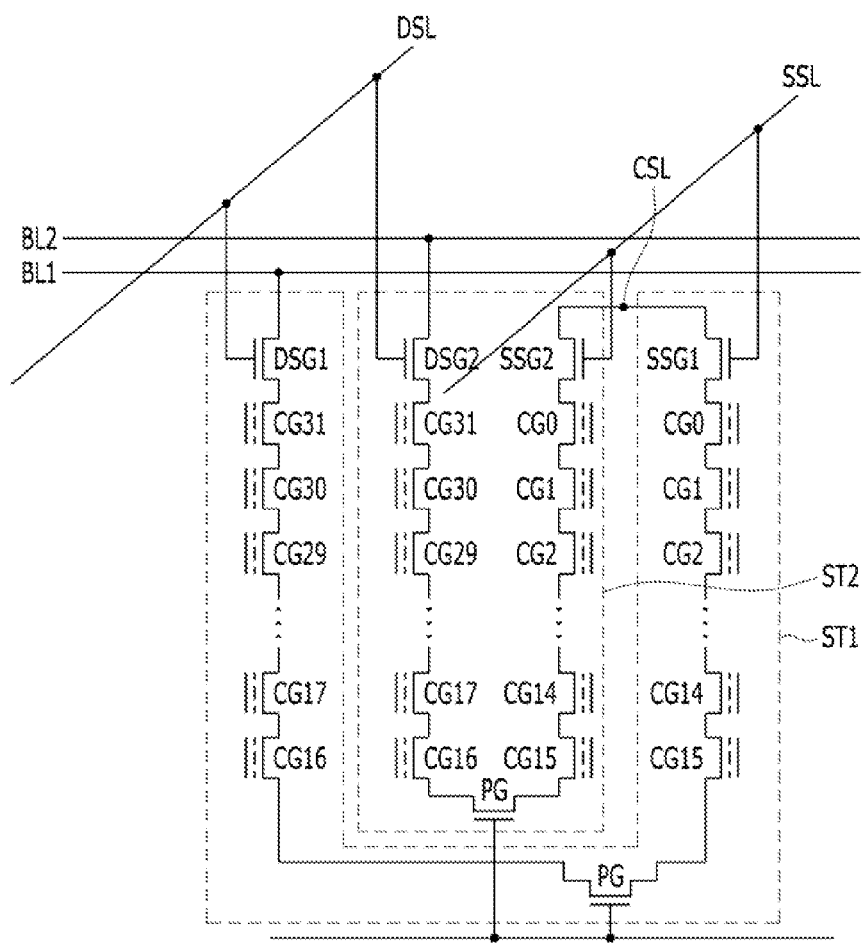

FIG. 11 is a circuit diagram illustrating the equivalent circuit of the memory block BLKj having the second structure as described above with reference to FIGS. 9 and 10. For the sake of convenience in explanation, only a first string and a second string, which form a pair in the certain memory block BLKj realized in the second structure, are shown.

Referring to FIG. 11, in the certain memory block BLKj having the second structure, among the plurality of blocks of the memory device 150, as described above with reference to FIGS. 9 and 10, cell strings, each of which is implemented with one upper string and one lower string are electrically coupled through the pipe gate PG, may be provided in such a way as to define a plurality of pairs.

Namely, in the certain memory block BLKj having the second structure, memory cells CG0 to CG31 stacked along a first channel CH1 (not shown), for example, at least one source select gate SSG and at least one drain select gate DSG may form a first string ST1, and memory cells CG0 to CG31 stacked along a second channel CH2 (not shown), for example, at least one source select gate SSG and at least one drain select gate DSG may form a second string ST2.

The first string ST1 and the second string ST2 are electrically coupled to the same drain select line DSL and the same source select line SSL. The first string ST1 is electrically coupled to a first bit line BL1, and the second string ST2 is electrically coupled to a second bit line BL2.

While it is described in FIG. 11 for the sake of convenience in explanation that the first string ST1 and the second string ST2 are electrically coupled to the same drain select line DSL and the same source select line SSL, it may be envisaged that the first string ST1 and the second string ST2 are electrically coupled to the same source select line SSL and the same bit line BL, the first string ST1 is electrically coupled to a first drain select line DSL1 and the second string ST2 is electrically coupled to a second drain select line DSL2, or it may be envisaged that the first string ST1 and the second string ST2 are electrically coupled to the same drain select line DSL and the same bit line BL, the first string ST1 is electrically coupled to a first source select line SSL1 and the second string ST2 is electrically coupled a second source select line SSL2.

Hereinbelow, a data program operation for processing data for a memory device in a memory system in accordance with an embodiment of the present invention is described in detail.

Figure 12:
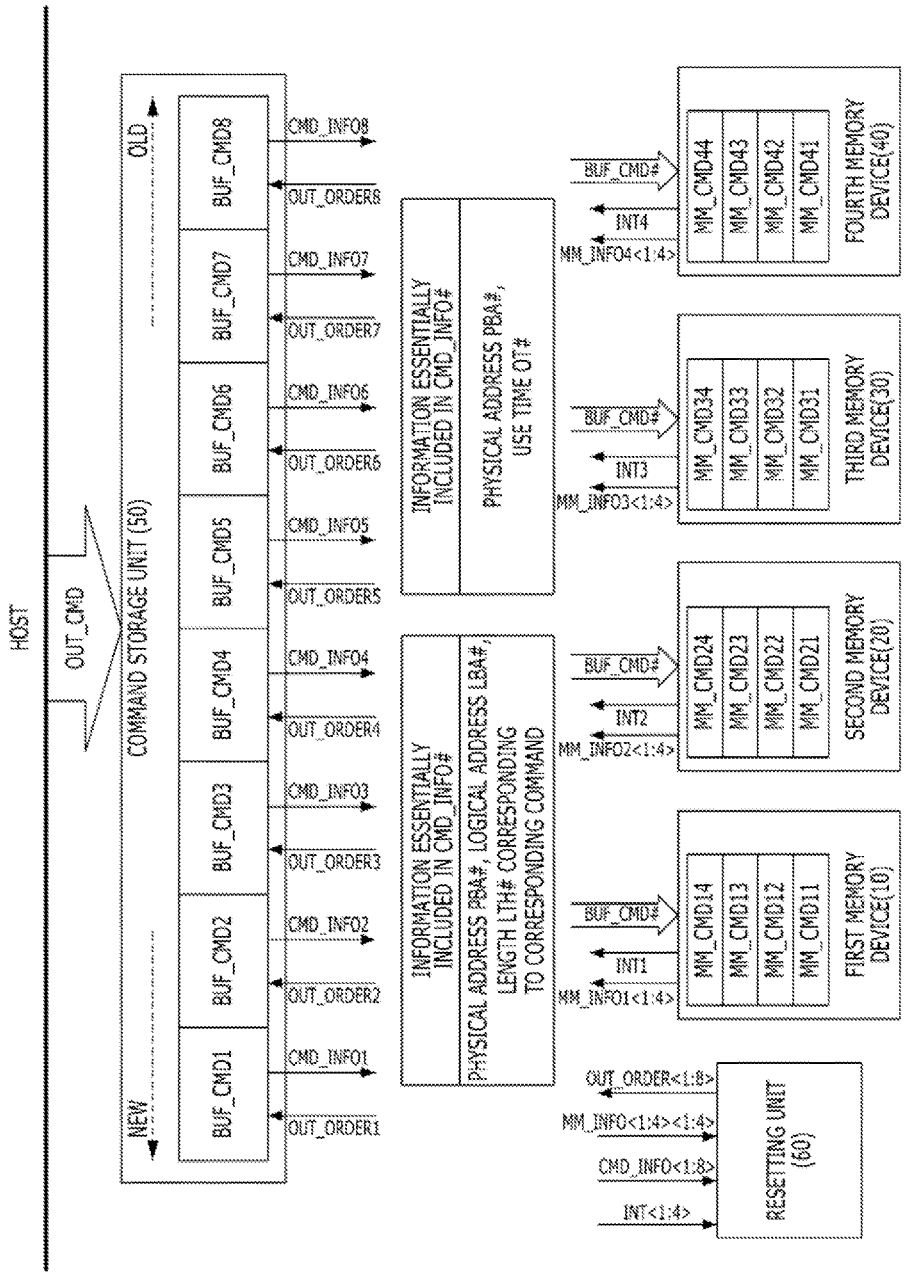
FIG. 12 is a block diagram illustrating a memory system in accordance with an embodiment of the present invention.

FIG. 12 is a block diagram illustrating a memory system in accordance with an embodiment of the present invention.

Referring to FIG. 12, the memory system in accordance with the embodiment of the present invention may include a plurality of memory devices 10, 20, 30, and 40, a command storage unit 50, and a resetting unit 60.

For reference, each of the plurality of memory devices 10, 20, 30, and 40 may correspond to the memory device 150 of the memory system 110 illustrated in FIG. 1. Furthermore, in FIG. 12, first to fourth memory devices 10, 20, 30, and 40 are included, but this is for convenience of description. Memory devices less than or greater than 4 may be included. Accordingly, in the following description, it is assumed that the first to fourth memory devices 10, 20, 30, and 40 are included in the memory system.

The command storage unit 50 may store a maximum of N commands OUT_CMD received from a host HOST. In this case, the command storage unit 50 sequentially stores the commands OUT_CMD received from the host HOST in a queue form.

For example, if any command is not stored in the command storage unit 50, the command storage unit 50 may store a first command OUT_CMD received from the host HOST as an $N^{th}$ command BUF_CMDN. Next, the command storage unit 50 may store a second command OUT_CMD received from the host HOST as an $(N-1)^{th}$ command BUF_CMDN-1. If the command storage unit 50 stores an $N^{th}$ command OUT_CMD received from the host HOST as a first command BUF_CMD1, a maximum of N commands may be stored in the command storage unit 50.

In this case, the command storage unit 50 may store the commands OUT_CMD by shifting the commands OUT_CMD received from the host HOST. For example, if any command is not stored in the command storage unit 50, the command storage unit 50 may store a first command OUT_CMD received from the host HOST as a first command BUF_CMD1. Next, when a second command OUT_CMD is received from the host HOST, the command storage unit 50 shifts the first command BUF_CMD1 to a second command BUF_CMD2 and stores the newly received second command OUT_CMD as the first command BUF_CMD1. Next, when a third command OUT_CMD is received from the host HOST, the command storage unit 50 shifts the previous second command BUF_CMD2 to a third command BUF_CMD3, shifts the previous first command BUF_CMD1 to the second command BUF_CMD2, and stores the newly received third command OUT_CMD as the first command BUF_CMD1. In this case, a maximum of N commands are stored in the command storage unit 50.

For reference, in FIG. 12, N is assumed to be 8, and 8 commands OUT_CMD received from the host HOST have been illustrated as being stored as commands BUF_CMD<1:8>. However, the value of N of 8 is only an example, and N may be defined as a value greater than or smaller than 8 depending on design. Accordingly, in the following description, N is assumed to be 8. Furthermore, it is assumed that the command storage unit 50 stores the commands OUT_CMD received from the host HOST by sequentially shifting the commands OUT_CMD. That is, the first command BUF_CMD1 of the maximum 8 commands BUF_CMD<1:8> stored in the command storage unit 50 is the most recently stored command.

Each of the plurality of memory devices 10, 20, 30, and 40 divides the commands OUT_CMD received from the host HOST by a maximum M and stores the commands. That is, the commands OUT_CMD received from the host HOST are stored in the command storage unit 50, transferred to the plurality of memory devices 10, 20, 30, and 40, and distributed and stored in the plurality of memory devices 10, 20, 30, and 40. In this case, maximum M commands MM_CMD1#, MM_CMD2#, MM_CMD3#, and MM_CMD4# are respectively stored in the plurality of memory devices 10, 20, 30, and 40.

For reference, in FIG. 12, M is assumed to be 4, and the maximum four commands MM_CMD1<1:4>, MM_CMD2<1:4>, MM_CMD3<1:4>, and MM_CMD4<1:4> have been illustrated as being respectively stored in the plurality of memory devices 10, 20, 30, and 40. However, the value of M of 4 is only an example, and M may be defined as a value greater than or smaller than 4 depending on design. Accordingly, in the following description, M is assumed to be 4.

Furthermore, the plurality of memory devices 10, 20, 30, and 40 performs respective set operations in response to the maximum four commands MM_CMD1<1:4>, MM_CMD2<1:4>, MM_CMD3<1:4>, and MM_CMD4<1:4> stored therein in order of input. For example, with the first memory device 10, it may be assumed that two commands MM_CMD1<1:2> are stored therein and storage spaces for the remaining two command MM_CMD1<3:4> are empty. In this case, the first memory device 10 performs a first operation set in response to a first command MM_CMD11. After the set first operation is terminated, the first memory device 10 performs a second operation set in response to a second command MM_CMD12. In this way, the first memory device 10 sequentially performs the first and second operations set in response to the first and second commands MM_CMD11 and MM_CMD12. In this case, if the four commands MM_CMD1<1:4> are stored in the first memory device 10, four set operations may be sequentially performed.

Whenever the command OUT_CMD received from the host HOST is stored in the command storage unit 50, the resetting unit 60 resets execution sequences OUT_ORDER<1:8> of the maximum 8 commands BUF_CMD<1:8> to be stored in the command storage unit 50 based on execution information CMD_INFO<1:8> and execution information MM_INFO<1:4><1:4>, and distributes the reset commands BUF_CMD<1:8> to the first to fourth memory devices 10, 20, 30, and 40. Here, the execution information CMD_INFO<1:8> includes the respective maximum 8 commands BUF_CMD<1:8> to be stored in the command storage unit 50, and the execution information MM_INFO<1:4><1:4> is information regarding the respective maximum 16 commands MM_CMD<1:4><1:4> to be respectively stored in the first to fourth memory devices 10, 20, 30, and 40 up to every four.

In this case, the execution information CMD_INFO<1:8> and MM_INFO<1:4><1:4> on each of a total of maximum 24 commands BUF_CMD<1:8> and MM_CMD<1:4><1:4> input to the resetting unit 60 may include a logical address LBA#, a physical address PBA#, a length LTH#, and a use time OT# corresponding to each of the total of maximum 24 commands BUF_CMD<1:8> and MM_CMD<1:4><1:4>. The execution information CMD_INFO<1:8> and MM_INFO<1:4><1:4> on each of the total of maximum 24 commands BUF_CMD<1:8> and MM_CMD<1:4><1:4> are input when they have been previously included in the memory system whenever the command OUT_CMD is received from the host HOST without a separate generation circuit. Information that needs to be included and input may be changed by design.

Physical addresses PBA<1:8>, logical addresses LBA<1:8>, and lengths LTH<1:8> may included in the execution information CMD_INFO<1:8> on the maximum 8 commands BUF_CMD<1:8> stored in the command storage unit 50, since the resetting unit 60 uses the physical addresses PBA<1:8>, the logical addresses LBA<1:8>, and the lengths LTH<1:8>.

Furthermore, physical addresses PBA<1:4><1:4> and use times OT<1:4><1:4> may be included in the execution information MM_INFO<1:4><1:4> on the total of maximum 16 commands MM_CMD<1:4><1:4> stored in the first to fourth memory devices 10, 20, 30, and 40 every up to four, since the resetting unit 60 uses the physical addresses PBA<1:4><1:4> and the use times OT<1:4><1:4>.

The resetting unit 60 receives information INT<1:4> on the number of commands respectively stored in the first to fourth memory devices 10, 20, 30, and 40 along with the execution information CMD_INFO<1:8> and MM_INFO<1:4><1:4> on the total of maximum 24 commands BUF_CMD<1:8> and MM_CMD<1:4><1:4>, resets the execution sequences OUT_ORDER<1:8> of the maximum 8 commands BUF_CMD<1:8> stored in the command storage unit 50, and distributes the reset commands BUF_CMD<1:8> to the first to fourth memory devices 10, 20, 30, and 40.

In this case, as illustrated in FIG. 12, the Information INT<1:4> on the number of commands stored in the first to fourth memory devices 10, 20, 30, and 40 may be generated within the first to fourth memory devices 10, 20, 30, and 40. Furthermore, in some embodiments, the information INT<1:4> on the number of commands may be generated using a separate element for counting the number of commands transferred between the first to fourth memory devices 10, 20, 30, and 40 within the command storage unit 50. That is, a method of generating the information INT<1:4> on the number of commands respectively stored in the first to fourth memory devices 10, 20, 30, and 40 may be determined by design.

Furthermore, when the command OUT_CMD received from the host HOST is stored in the command storage unit 50 and commands greater than a number set in the command storage unit 50 in which the maximum 8 commands BUF_CMD<1:8> may be stored have been stored, the resetting unit 60 may reset the execution sequences OUT_ORDER<1:8> of the maximum 8 commands BUF_CMD<1:8> and distribute the reset commands BUF_CMD<1:8> to the first to fourth memory devices 10, 20, 30, and 40. That is, performing an operation for resetting the execution sequences of commands when only a very small number of commands have been stored in the command storage unit 50 may be inefficient. Accordingly, an operation for resetting the execution sequences of commands may be performed only when commands greater than a number set in the command storage unit 50 are stored. For example, when three or more commands BUF_CMD<1:3> are stored in the command storage unit 50, an operation for resetting the execution sequences OUT_ORDER<1:8> of the three or more commands BUF_CMD<1:3> may be performed. In this case, the set number, that is, a base for the operation of the command storage unit 50, may be changed by design. The set number may be a number greater than or smaller than 3.

FIG. 13 is a flowchart illustrating an operation method of the memory system of FIG. 12 in accordance with an embodiment of the present invention.

Referring to FIG. 13, the operation method based on the commands BUF_CMD<1:8> stored in the command storage unit 50 in the memory system in accordance with the embodiment of the present invention will be explained in detail.

In an input operation 5130, the commands OUT_CMD are received from the host HOST and are sequentially stored in the command storage unit 50. As described above, the execution sequences OUT_ORDER<1:8> of the maximum 8 commands BUF_CMD<1:8> stored in the command storage unit 50 are reset by the resetting unit 60 and distributed to the first to fourth memory devices 10, 20, 30, and 40.

In a length determination operation S131, it is determined whether the length LTH1 of the first command BUF_CMD1 most recently stored in the command storage unit 50 is greater than a set length.

When the length LTH1 of the first command BUF_CMD1 most recently stored in the command storage unit 50 is greater than the set length, an operation S134 is performed to set the most recently stored first command BUF_CMD1 to an "exclusion command" so that the first command BUF_CMD1 is excluded from the target of a resetting operation S133 in which the resetting unit 60 resets the execution sequences OUT_ORDER<1:8> of the maximum 8 commands BUF_CMD<1:8>.

After the first command BUF_CMD1 that belongs to the maximum 8 commands BUF_CMD<1:8> stored in the command storage unit 50 and that has been most recently stored is set to the "exclusion command", the resetting operation S133 for resetting the execution sequences OUT_ORDER<2:8> of only the remaining maximum 7 commands BUF_CMD<2:8> is performed.

In this case, the "exclusion command" is used in an operation S135 for finally distributing the first command BUF_CMD1 to the first to fourth memory devices 10, 20, 30, and 40 after distributing all the remaining maximum 7 commands BUF_CMD<2:8> to the first to fourth memory devices 10, 20, 30, and 40 in the resetting operation S133.

For example, assuming that the 8 commands BUF_CMD<1:8> have been stored in the command storage unit 50 and the length LTH1 of the first command BUF_CMD1 that has been most recently received is greater than the set length, the first command BUF_CMD1 is set to the "exclusion command", and the execution sequence OUT_ORDER1 of the first command BUF_CMD1 becomes the last of the 8 commands BUF_CMD<1:8>. That is, after the second to eighth commands BUF_CMD<2:8> of the 8 commands BUF_CMD<1:8> are distributed to the first to fourth memory devices 10, 20, 30, and 40 in the resetting operation S133 for resetting the execution sequences OUT_ORDER<1:8> of the 8 commands BUF_CMD<1:8>, the operation S135 for distributing the first command BUF_CMD1, that is, the "exclusion command", to the first to fourth memory devices 10, 20, 30, and 40 is finally performed.

Furthermore, in the length determination operation S131, the length LTH# of the command BUF_CMD# that is used as a base is the size of data which is input/output to/from the first to fourth memory devices 10, 20, 30, and 40 in response to a corresponding command BUF_CMD#. For example, data of 4 Kbytes may be input/output to/from the first to fourth memory devices 10, 20, 30, and 40, data of 1 Mbyte may be input/output to/from the first to fourth memory devices 10, 20, 30, and 40, or data of 1 Gbyte may be input/output to/from the first to fourth memory devices 10, 20, 30, and 40 in response to a corresponding command BUF_CMD#. When it is assumed that the set length is 10 Mbytes, data of 4 Kbytes input/output to/from the first to fourth memory devices 10, 20, 30, and 40 or data of 1 Mbyte input/output to/from the first to fourth memory devices 10, 20, 30, and 40 in response to the corresponding command BUF_CMD# is smaller than the set length. In contrast, data of 1 Gbyte input/output to/from the first to fourth memory devices 10, 20, 30, and 40 in response to the corresponding command BUF_CMD# is greater than the set length.

The reason why the length determination operation S131 is required is that a time for inputting/outputting data to/from the first to fourth memory devices 10, 20, 30, and 40 in response to the corresponding command BUF_CMD# increases as the size of the data increases. Accordingly, if a command having a relatively large size is not controlled to have the last sequence through the length determination operation S131, commands having relatively smaller sizes may be stagnated without being executed while the command having the relatively very large size is executed. As a result, data processing speed of the entire memory system may be reduced.

There is no concern although the second to eighth commands BUF_CMD<2:8> stored in the command storage unit 50 prior to the first command BUF_CMD1 set to the "exclusion command" are distributed to the first to fourth memory devices 10, 20, 30, and 40 in the resetting operation 133.

While the second to eighth commands BUF_CMD<2:8> stored in the command storage unit 50 prior to the first command BUF_CMD1 set to the "exclusion command" are distributed to the first to fourth memory devices 10, 20, 30, and 40 and used in the resetting operation S133, the command OUT_CMD may be newly received from the host HOST and stored in the command storage unit 50. That is, if the command OUT_CMD to be stored in the command storage unit 50 after the "exclusion command" is to be executed through the resetting operation S133 prior to the "exclusion command", the execution sequence of the "exclusion command" may be infinitely relegated back. For this reason, the command OUT_CMD to be stored in the command storage unit 50 after the "exclusion command" may be applied to the resetting operation S133 after the "exclusion command" Is executed.

In a group check operation S132, if two or more commands of the maximum 8 commands BUF_CMD<1:8> stored in the command storage unit 50 have the values of consecutive logical addresses LBA#, the two or more commands are combined into a group. As a result, the resetting operation S133 is simultaneously applied to the two or more commands combined into the group. That is, if the logical addresses LBA# of the two or more commands have consecutive values, this means that there is a good possibility that the host HOST may consecutively input/output data for a specific purpose. Accordingly, to use two or more commands having consecutive logical addresses LBA# in the continuity state may be more efficient.

Furthermore, regarding the order that the two or more commands combined into the group in the group check operation S132 are used, a command having the value of a former logical address LBA# may be first used, and a command having the value of a latter logical address LBA# may then be used. In some embodiments, the command having the value of the latter logical address LBA# may be first used, and the command having the value of the former logical address LBA# may be then used depending on design.

In the resetting operation S133, the execution sequences OUT_ORDER<1:8> of the maximum 8 commands BUF_CMD<1:8> are reset through three conditions step by step.

When the resetting operation S133 is entered, first, a first priority for each of the maximum 8 commands BUF_CMD<1:8> is determined based on whether a first condition "Condition A" is satisfied in an operation S1331. In the first condition "Condition A", the first to fourth memory devices 10, 20, 30, and 40 are classified into a "first resetting memory device" having a high first priority and a "second resetting memory device" having a low first priority based on use times OT<1:4><1:4> required to use all the maximum four commands MM_CMD<1:4><1:4> stored in the first to fourth memory devices 10, 20, 30, and 40.

That is, a memory device having relatively short use times OT<1:4><1:4> required to use all the maximum four commands MM_CMD<1:4><1:4> stored in the first to fourth memory devices 10, 20, 30, and 40 may be set to the "first resetting memory device". The remaining memory device of the first to fourth memory devices 10, 20, 30, and 40 except for the "first resetting memory device" may be set to the "second resetting memory device."

For example, assuming that a use time OT1<1:4> required to perform a set operation in response to all the maximum four commands MM_CMD1<1:4> stored in the first memory device 10 is smaller than use times OT<1:4><1:4> required to perform set operations in response to all the maximum four commands MM_CMD<2:4><1:4> stored in each of the remaining second to the fourth memory devices 20, 30, and 40, the first memory device 10 may be set to the "first resetting memory device", and the remaining second to fourth memory devices 20, 30, and 40 may be set to the "second resetting memory device."

In this case, in the operation S1331, a command BUF_CMD# that belongs to the maximum 8 commands BUF_CMD<1:8> stored in the command storage unit 50 and that corresponds to the "first resetting memory device" may be set to a "first resetting command." A command BUF_CMD# that belongs to the maximum 8 commands BUF_CMD<1:8> stored in the command storage unit 50 and that corresponds to the "second resetting memory device" may be set to a "second resetting command."

The "first resetting command" complying with the first condition "Condition A" is always present because the first condition "Condition A" is a relative point of view. Accordingly, whether a second condition "Condition B" is satisfied is determined with respect to only the "first resetting command." That is, in an operation S1332, a second priority for each of one or more "first resetting commands" is determined based on whether the second condition "Condition B" is satisfied.

In the second condition "Condition B", the one or more "first resetting commands" are classified into a "third resetting command" having a high second priority and a "fourth resetting command" having a low second priority based on a correlation between the values of the physical addresses PBA# of the maximum four commands MM_CMD# stored in each of the one or more "first resetting memory devices" and the values of the physical addresses PBA# of the one or more "first resetting commands".

That is, in the operation S1332, based on the values of the physical addresses PBA# of the maximum four commands MM_CMD# stored in each of the one or more "first resetting memory devices", a "first resetting command" that is consecutive to or has the same value as the values of the physical addresses PBA# of the one or more "first resetting commands" may be set to the "third resetting command", and a "first resetting command" that is not consecutive to or does not have the same value as the values of the physical addresses PBA# of the one or more "first resetting commands" may be set to the "fourth resetting command."

In this case, a memory device that belongs to the "first resetting memory devices" and that corresponds to the "third resetting command" may be set to the "third resetting memory device." A memory device that belongs to the "first resetting memory devices" and that corresponds to the "fourth resetting command" may be set to the "fourth resetting memory device."

Furthermore, the execution sequence of the "third resetting command" is advanced compared to the "fourth resetting command." That is, the "third resetting command" is directly distributed to the first to fourth memory devices 10, 20, 30, and 40 and used without a change in operation S1334.

A "third resetting command" complying with the second condition "Condition B" may or may not be present because the second condition "Condition B" is an absolute point of view. Accordingly, whether a third condition "Condition C" is satisfied is determined with respect to only a "fourth resetting command" if the "third resetting command" is not present. That is, in an operation S1333, a third priority for each of one or more "fourth resetting commands" is determined based on whether the third condition "Condition C" is satisfied.

In the third condition "Condition C", one or more "fourth resetting commands" are classified into a "fifth resetting command" having a high third priority and a "sixth resetting command" having a low third priority based on the number INT# of commands MM_CMD# stored in each of the "fourth resetting memory device" of the first to fourth memory devices 10, 20, 30, and 40.

That is, in the operation S1333, a "fourth resetting command" that belongs to the one or more "fourth resetting commands" and that corresponds to a "fourth resetting memory device" in which a relatively small number of commands MM_CMD# have been stored may be set to the "fifth resetting command." The remaining "fourth resetting commands" except for the "fifth resetting command" may be set to the "sixth resetting command."

In this case, a memory device that belongs to the "fourth resetting memory devices" and that corresponds to the "fifth resetting command" may be set to a "fifth resetting memory device". A memory device that belongs to the "fourth resetting memory devices" and that corresponds to the "sixth resetting command" may be set to a "sixth resetting memory device."

For example, it is assumed that two commands MM_CMD1<1:2> have been stored in the first memory device 10 and one command MM_CMD31 has been stored in the third memory device 30 if the first memory device 10 and the third memory device 30 of the first to fourth memory devices 10, 20, 30, and 40 have been set to the "fourth resetting memory devices". At this time, a "fourth resetting command" corresponding to the third memory device 30 may be set to a "fifth resetting command", and a "fourth resetting command" corresponding to the first memory device 10 may be set to a "sixth resetting command." Furthermore, the third memory device 30 may be set to a "fifth resetting memory device", and the first memory device 10 may be set to a "sixth resetting memory device."

Furthermore, the execution sequence of the "fifth resetting command" is advanced compared to the "sixth resetting command." That is, the "fifth resetting command" is directly distributed to the first to fourth memory devices 10, 20, 30, and 40 and used in the operation S1334.

After checking whether the third condition "Condition C" is satisfied, the resetting operation S133 is terminated. Although the "resetting operation" has been terminated, there may be a command whose sequence has not yet been determined. That is, two or more of the 8 commands BUF_CMD<1:8> stored in the command storage unit 50 may be classified as "sixth resetting commands". In this case, two processing methods may be used.

In a first method, the sequences of two or more "sixth resetting commands" may be clearly determined by repeatedly performing the resetting operation S133 on the two or more "sixth resetting commands." In general, this method is used when three or more commands are classified into "sixth resetting commands."

In a second method, the sequences of two or more "sixth resetting commands" are determined so that the two or more "sixth resetting commands" have been received from the host HOST. In general, this method is used when two commands or less are classified into "sixth resetting commands."

Any one of the first and second methods may be selected and used or the first and second methods may be properly mixed and used depending on design.

FIGS. 14A to 14D are block diagrams illustrating a data processing operation of the memory system of FIG. 12 in accordance with an embodiment of the present invention.

Referring to FIGS. 14A to 14D, it may be seen that commands having various values are stored in the command storage unit 50 of the memory system of FIG. 12 in accordance with the embodiment of the present invention.

More specifically, 8 commands BUF_CMD<1:8> stored in the command storage unit 50 are described below. The first command BUF_CMD1 is a command for reading data stored in a logical address LBA900. Execution information CMD_INFO1 on the first command BUF_CMD1 is described below. A physical address PBA1 indicates the first page of the second block of the second memory device 20, i.e., {MEMORY, BLOCK, PAGE}=2, 2, 1, and a length LTH1 is 1 Gbyte.

The second command BUF_CMD2 is a command for reading data stored in a logical address LBA400. Execution information CMD_INFO2 on the second command BUF_CMD2 is described below. A physical address PBA2 indicates the eighth page of the third block of the first memory device 10, i.e., {MEMORY, BLOCK, PAGE}=1, 3, 8, and a length LTH2 is 4 Kbytes.

The third command BUF_CMD3 is a command for reading data stored in a logical address LBA800. Execution information CMD_INFO3 on the third command BUF_CMD3 is described below. A physical address PBA3 indicates the fifth page of the eleventh block of the third memory device 30, i.e., {MEMORY, BLOCK, PAGE}=3, 11, 5, and a length LTH3 is 1 Kbyte.

The fourth command BUF_CMD4 is a command for reading data stored in a logical address LBA100. Execution information CMD_INFO4 on the fourth command BUF_CMD4 is described below. A physical address PBA4 indicates the eighth page of the third block of the first memory device 10, i.e., {MEMORY, BLOCK, PAGE}=1, 3, 8, and a length LTH1 is 8 Kbytes.

The fifth command BUF_CMD5 is a command for reading data stored in a logical address LBA700. Execution information CMD_INFO5 on the fifth command BUF_CMD5 is described below. A physical address PBA5 indicates the twentieth page of the tenth block of the third memory device 30, i.e., {MEMORY, BLOCK, PAGE}=3, 10, 20, and a length LTH5 is 16 Kbytes.

The sixth command BUF_CMD6 is a command for reading data stored in a logical address LBA300. Execution information CMD_INFO6 on the sixth command BUF_CMD6 is described below. A physical address PBA6 indicates the fifth page of the seventh block of the third memory device 30, i.e., {MEMORY, BLOCK, PAGE}=3, 7, 5, and a length LTH6 is 4 Kbytes.

The seventh command BUF_CMD7 is a command for reading data stored in a logical address LBA50. Execution information CMD_INFO7 on the seventh command BUF_CMD7 is described below. A physical address PBA7 indicates the fifth page of the ninth block of the fourth memory device 40, i.e., {MEMORY, BLOCK, PAGE}=4, 9, 5, and a length LTH1 is 32 Kbytes.

The eighth command BUF_CMD8 is a command for reading data stored in a logical address LBA40. Execution information CMD_INFO8 on the eighth command BUF_CMD8 is described below. A physical address PBA8 indicates the sixth page of the ninth block of the fourth memory device 40, i.e., {MEMORY, BLOCK, PAGE}=4, 9, 6, and a length LTH8 is 32 Kbytes.

Likewise, it may be seen that the first to fourth memory devices 10, 20, 30, and 40 also store commands having various values and perform their set operations.

More specifically, commands MM_CMD<1:4># stored in each of the first to fourth memory devices 10, 20, 30, and 40 are described below. Only one command MM_CMD11 is stored in the first memory device 10, and the first command MM_CMD11 of the first memory device 10 is a command for writing data. At this time, information INT1 on the number of commands is set to "1". Execution information MM_INFO11 on the first command MM_CMD11 of the first memory device 10 is described below. A physical address PBA11 indicates the eleventh page of the twelfth block of the first memory device 10, i.e., {MEMORY, BLOCK, PAGE}=1, 12, 11, and an execution time OT11 is 500 us.

Only one command MM_CMD21 is stored in the second memory device 20, and the first command MM_CMD21 of the second memory device 20 is a command for writing data. At this time, information INT2 on the number of commands is set to "1". Execution information MM_INFO21 on the first command MM_CMD21 of the second memory device 20 is described below. A physical address PBA21 indicates the twenty-second page of the fifth block of the second memory device 20, i.e., {MEMORY, BLOCK, PAGE}=2, 5, 22, and an execution time OT21 is 2500 us.

Only one command MM_CMD31 is stored in the third memory device 30, and the first command MM_CMD31 of the third memory device 30 is a command for writing data. At this time, information INT3 on the number of commands is set to "1". Execution information MM_INFO31 on the first command MM_CMD31 of the third memory device 30 is described below. A physical address PBA31 indicates the eleventh page of the fourteenth block of the third memory device 30, i.e., {MEMORY, BLOCK, PAGE}=3, 14, 11, and an execution time OT31 is 500 us.

Only two commands MM_CMD4<1:2> are stored in the fourth memory device 40, and the first and the second commands MM_CMD4<1:2> of the fourth memory device 40 are commands for writing data. At this time, information INT4 on the number of commands is set to "2". Execution information MM_INFO41 on the first command MM_CMD41 of the fourth memory device 40 is described below. A physical address PBA41 indicates the nineteenth page of the eleventh block of the fourth memory device 40, i.e., {MEMORY, BLOCK, PAGE}=4, 11, 19. Execution information MM_INFO42 on the second command MM_CMD42 of the fourth memory device 40 is described below. A physical address PBA42 indicates the twenty-fifth page of the nineteenth block of the fourth memory device 40, i.e., {MEMORY, BLOCK, PAGE}=4, 19, 25. The total execution time OT41+42 of the first command MM_CMD41 and second command MM_CMD42 of the fourth memory device 40 is 3000 us.

Figure 14A:
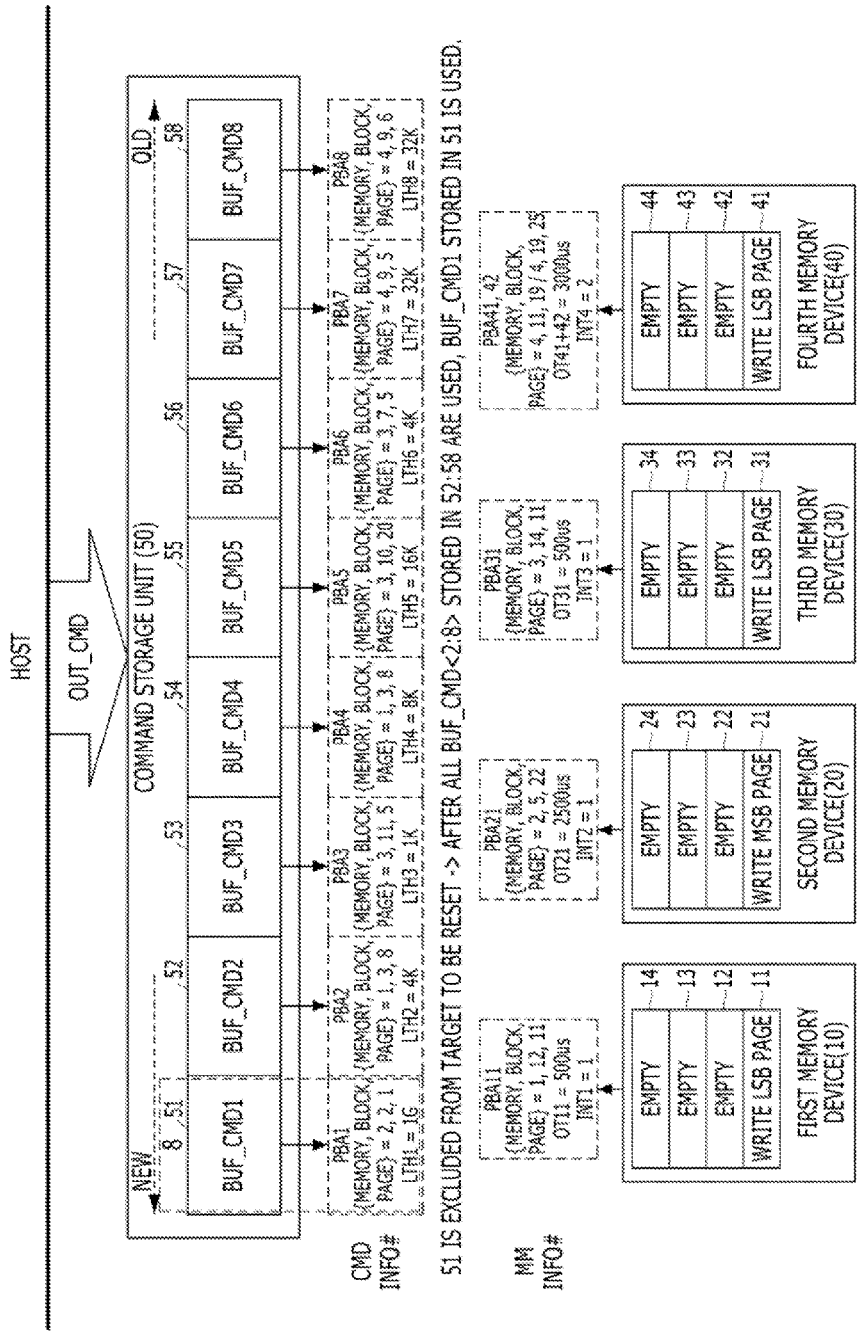
FIGS. 14A to 14D are block diagrams illustrating a data processing operation of the memory system of FIG. 12 in accordance with an embodiment of the present invention.

Referring to FIG. 14A, it may be seen that the length LTH1 of the first command BUF_CMD1 of the 8 commands BUF_CMD<1:8> stored in the command storage unit 50 is 1 Gbyte, which is a relatively long length. That is, the first command BUF_CMD1 is set to an "exclusion command."

Accordingly, the first command BUF_CMD1 may be set to the "exclusion command" by the length determination operation S131, and only the execution sequences OUT_ORDER<2:8> of the remaining second to eighth commands BUF_CMD<2:8> may be reset by the resetting operation S133 of the resetting unit 60.

In this case, after all the sequences of the second to eighth commands BUF_CMD<2:8> are reset by the resetting unit 60 and the operation S133 for distributing the reset second to eighth commands BUF_CMD<2:8> to the first to fourth memory devices 10, 20, 30, and 40 is performed, the operation S135 for finally distributing the first command BUF_CMD1 is performed. For this reason, the reference numeral "8" assigned to the first command BUF_CMD1 denotes that the first command BUF_CMD1 is executed eighth, that is, finally.

Figure 14B:
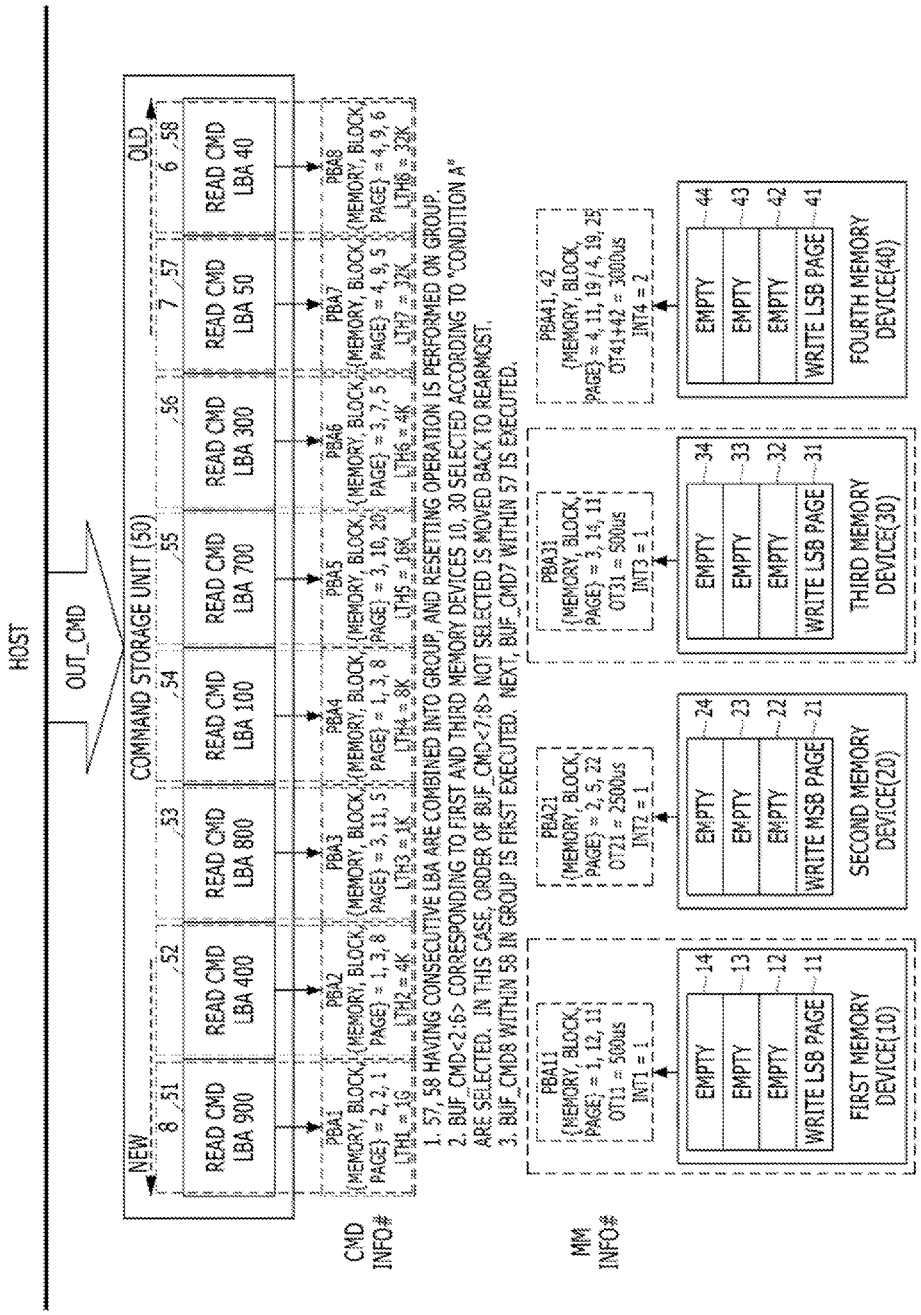

Referring to FIG. 14B, it may be seen that the logical addresses LBA7 and LBA8 of the seventh command BUF_CMD7 and eighth command BUF_CMD8 of the 8 commands BUF_CMD<1:8> stored in the command storage unit 50 have consecutive values. That is, it may be seen that the seventh and the eighth logical addresses LBA7 and LBA8 have consecutive logical addresses because the value of the logical address LBA7 of the seventh command BUF_CMD7 is 50 and the value of the logical address LBA8 of the eighth command BUF_CMD8 is 40.

Accordingly, the seventh command BUF_CMD7 and the eighth command BUF_CMD8 are combined into a group by the group check operation S132. That is, the seventh command BUF_CMD7 and the eighth command BUF_CMD8 are always applied together when the execution sequences OUT_ORDER7 and OUT_ORDER8 of the seventh command BUF_CMD7 and the eighth command BUF_CMD8 are reset by the resetting operation S133 of the resetting unit 60.

As described above, although the seventh command BUF_CMD7 and the eighth command BUF_CMD8 have been combined into the group, the value of the logical address LBA8 of the eighth command BUF_CMD8 is earlier than that of the logical address LBA7 of the seventh command BUF_CMD7 because the value of the logical address LBA7 of the seventh command BUF_CMD7 is 50 and the value of the logical address LBA8 of the eighth command BUF_CMD8 is 40.

Accordingly, when the resetting sequences of the seventh command BUF_CMD7 and the eighth command BUF_CMD8 combined into the group are determined, the eighth command BUF_CMD8 is first executed and the seventh command BUF_CMD7 is then executed in the corresponding sequences.

The seventh command BUF_CMD7 and the eighth command BUF_CMD8 combined into the group enter the resetting operation S133 of the resetting unit 60 along with the second to sixth commands BUF_CMD<2:6>, and thus the execution sequences thereof are reset.

Accordingly, a first priority is determined based on whether the first condition "Condition A" is satisfied with respect to each of the seventh command BUF_CMD7 and eighth command BUF_CMD8 combined into the group and the second to sixth commands BUF_CMD<2:6>.

Whether the first condition "Condition A" is satisfied is determined based on the use times OT<1:4><1:4> required to use all the maximum four commands MM_CMD<1:4><1:4> respectively stored in the first to fourth memory devices 10, 20, 30, and 40.

Hereinafter, the use times OT<1:4><1:4> of the first to fourth memory devices 10, 20, 30, and 40 are described. The use time OT11 of the first memory device 10 is 500 us, the use time OT21 of the second memory device 20 is 2500 us, the use time OT31 of the third memory device 30 is 500 us, and the use time OT41+42 of the fourth memory device 40 is 3000 us.

Accordingly, the second to sixth commands BUF_CMD<2:6> that belong to the 8 commands BUF_CMD<1:8> stored in the command storage unit 50 and that correspond to the first memory device 10 and the third memory device 30 become "first resetting commands." Furthermore, the seventh and the eighth command BUF_CMD<7:8> that belong to the 8 commands BUF_CMD<1:8> stored in the command storage unit 50, that correspond to the fourth memory device 40, and that are combined into the group become "second resetting commands" due to the relatively long use times OT41+OT42 of the fourth memory device 40, i.e., 3000 us.

As described above, since the seventh and the eighth command BUF_CMD<7:8> combined into the group have the first priority lower than that of the remaining second to the sixth commands BUF_CMD<2:6>, the execution sequences OUT_ORDER<7:8> of the seventh and the eighth command BUF_CMD<7:8> combined into the group in the resetting operation S133 are controlled so that they are later than the execution sequences OUT_ORDER<2:6> of the second to sixth commands BUF_CMD<2:6>. For this reason, in FIG. 14B, the reference numeral "6" assigned to the eighth command BUF_CMD8 denotes that the eighth command BUF_CMD8 is executed sixth, and the reference numeral "7" assigned to the seventh command BUF_CMD7 denotes that the seventh command BUF_CMD7 is executed eighth.

Figure 14C:
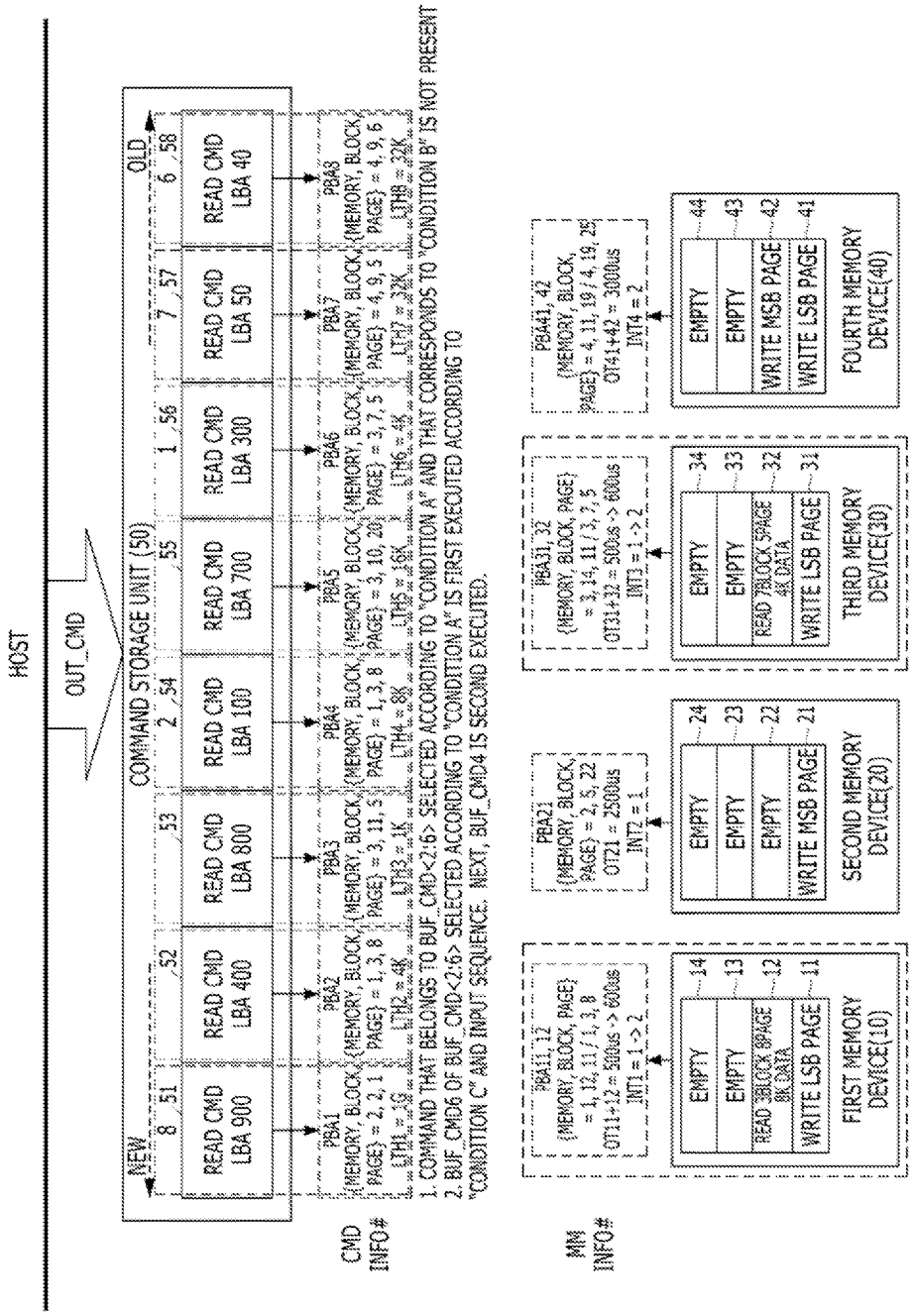

Referring to FIG. 14C, a second priority is determined based on whether the second condition "Condition B" is satisfied with respect to each of the second to sixth commands BUF_CMD<2:6>, that is, the "first resetting commands."

Whether the second condition "Condition B" is satisfied is determined based on a correlation between the values of the physical addresses PBA# of the maximum four commands MM_CMD# stored in each of one or more "first resetting memory devices" and the values of the physical addresses PBA# of one or more "first resetting commands".

Hereinafter, the correlation between the values of the physical addresses PBA1# and PBA3# of the commands MM_CMD1# and MM_CMD3# respectively stored in the first memory device 10 and the third memory device 30, that is, the "first resetting memory devices", and the values of the physical addresses PBA<2:6> of the second to the sixth commands BUF_CMD<2:6>, that is, the "first resetting commands", is described.

First, the physical address PBA11 of the first command MM_CMD11 of the first memory device 10 indicates the eleventh page of the twelfth block of the first memory device 10, i.e., {MEMORY, BLOCK, PAGE}=1, 12, 11. The physical address PBA31 of the first command MM_CMD31 of the third memory device 30 indicates the eleventh page of the fourteenth block of the third memory device 30, i.e., {MEMORY, BLOCK, PAGE}=3, 14, 11.

Furthermore, the physical address PBA2 of the second command BUF_CMD2 indicates the eighth page of the third block of the first memory device 10, i.e., {MEMORY, BLOCK, PAGE}=1, 3, 8. The physical address PBA3 of the third command BUF_CMD3 indicates the fifth page of the eleventh block of the third memory device 30, i.e., {MEMORY, BLOCK, PAGE}=3, 11, 5. The physical address PBA4 of the fourth command BUF_CMD4 is the eighth page of the third block of the first memory device 10, i.e., {MEMORY, BLOCK, PAGE}=1, 3, 8. The physical address PBA5 of the fifth command BUF_CMD5 is the twentieth page of the tenth block of the third memory device 30, i.e., {MEMORY, BLOCK, PAGE}=3, 10, 20. The physical address PBA6 of the sixth command BUF_CMD6 is the fifth page of the seventh block of the third memory device 30, i.e., {MEMORY, BLOCK, PAGE}=3, 7, 5.

As described above, the values of the physical addresses PBA1# and PBA3# of the commands MM_CMD1# and MM_CMD3# respectively stored in the first memory device 10 and the third memory device 30, that is, the "first resetting memory devices", do not have any correlation with the values of the physical addresses PBA<2:6> of the second to the sixth commands BUF_CMD<2:6>, that is, the "first resetting commands."

Accordingly, there is no command that belongs to the second to sixth commands BUF_CMD<2:6> that become the "first resetting commands" because they comply with the first condition "Condition A" and that complies with the second condition "Condition B". All the second to sixth commands BUF_CMD<2:6> are classified as the "fourth resetting commands."

Next, a third priority is determined based on whether the third condition "Condition C" is satisfied with respect to each of the second to sixth commands BUF_CMD<2:6> that become the "fourth resetting commands" because they comply with the first condition "Condition A", but do not comply with the second condition "Condition B."

Whether the third condition "Condition C" Is satisfied is determined based on the number INT# of commands MM_CMD# stored in each of one or more "fourth resetting memory devices."

Hereinafter, the number of commands MM_CMD1# and MM_CMD3# respectively stored in the first memory device 10 and the third memory device 30, that is the "fourth resetting memory devices", is described.

First, only the one command MM_CMD11 is stored in a first space of the first memory device 10 in which the maximum four commands MM_CMD1<1:4> may be stored.

Furthermore, only one command MM_CMD31 is stored in a first space of the third memory device 30 in which the maximum four commands MM_CMD3<1:4> may be stored.

As described above, only the commands MM_CMD11 and MM_CMD31 are respectively stored in the first memory device 10 and the third memory device 30, that is, the "fourth resetting memory devices." That is, both the first memory device 10 and the third memory device 30 have high third priorities, and the second to sixth commands BUF_CMD<2:6> corresponding to the first memory device 10 and the third memory device 30 are classified into "fifth resetting commands" having a high third priority.

In this case, since only one of the second to sixth commands BUF_CMD<2:6> needs to be selected, a first sequence is assigned to the sixth command BUF_CMD6 that belongs to the second to sixth commands BUF_CMD<2:6> and that is uppermost input. Accordingly, the reference numeral "1" assigned to the sixth command BUF_CMD6 denotes that the sixth command BUF_CMD6 is executed first.

Furthermore, if the sixth command BUF_CMD6 is executed once, it means that the sixth command BUF_CMD6 is distributed to and stored in the third memory device 30. Accordingly, information regarding commands stored in the third memory device 30 is changed as follows.

Two commands MM_CMD3<1:2> have been stored in the third memory device 30, the first command MM_CMD31 of the third memory device 30 is a command for writing data, and the second command MM_CMD32 of the third memory device 30 is a command for reading data. At this time, the information INT3 on the number of commands is changed to "2" from "1". Execution information MM_INFO31 on the first command MM_CMD31 of the third memory device 30 is described below. The physical address PBA31 indicates the eleventh page of the fourteenth block of the third memory device 30, i.e., {MEMORY, BLOCK, PAGE}=3, 14, 11. Execution information MM_INFO32 on the second command MM_CMD32 of the third memory device 30 is described below. A physical address PBA32 indicates the fifth page of the seventh block of the third memory device 30, i.e., {MEMORY, BLOCK, PAGE}=3, 7, 5. The total execution time OT31+32 of the first command MM_CMD31 and second command MM_CMD32 of the third memory device 30 becomes 600 us.

As described above, the execution sequences OUT_ORDER<6:8> of the sixth to the eighth commands BUF_CMD<6:8> of the 8 commands BUF_CMD<1:8> stored in the command storage unit 50 have been determined by the resetting operation S133 through the first to third conditions "Condition A", "Condition B", and "Condition C", but the execution sequences OUT_ORDER<2:5> of the remaining second to fifth commands BUF_CMD<2:5> have not been determined. Accordingly, the resetting operation S133 is repeatedly performed.

Commands that belong to the second to fifth commands BUF_CMD<2:5> and that are classified into "first resetting commands" because they comply with the first condition "Condition A" include the second command BUF_CMD2 and the fourth command BUF_CMD4. Furthermore, since there is no command that belongs to the second command BUF_CMD2 and the fourth command BUF_CMD4 and that complies with the second condition "Condition B", both the second command BUF_CMD2 and the fourth command BUF_CMD4 are classified into "fourth resetting commands." Furthermore, both the second command BUF_CMD2 and the fourth command BUF_CMD4 are "fifth resetting commands" because they comply with the third condition "Condition C." A second sequence is assigned to the fourth command BUF_CMD4 that belongs to the second command BUF_CMD2 and the fourth command BUF_CMD4 set to the "fifth resetting commands" through such a process and that is first input.

Accordingly, the reference numeral "2" assigned to the fourth command BUF_CMD4 denotes that the fourth command BUF_CMD4 is executed second.

Furthermore, if the fourth command BUF_CMD4 is executed second, it means that the fourth command BUF_CMD4 is distributed to and stored in the first memory device 10. Accordingly, information regarding commands stored in the first memory device 10 is changed as follows.

The two commands MM_CMD1<1:2> have been stored in the first memory device 10, the first command MM_CMD11 of the first memory device 10 is a command for writing data, and the second command MM_CMD12 of the first memory device 10 is a command for reading data. At this time, the information INT1 on the number of commands is changed into "2" from "1". Execution information MM_INFO11 on the first command MM_CMD11 of the first memory device 10 is described below. The physical address PBA11 indicates the eleventh page of the twelfth block of the first memory device 10, i.e., {MEMORY, BLOCK, PAGE}=1, 12, 11. Execution information MM_INFO12 on the second command MM_CMD12 of the first memory device 10 is described below. A physical address PBA12 indicates the eighth page of the third block of the first memory device 10, i.e., {MEMORY, BLOCK, PAGE}=1, 3, 8. The total execution time OT11+12 of the first command MM_CMD11 and second command MM_CMD12 of the first memory device 10 becomes 600 us.

Figure 14D:
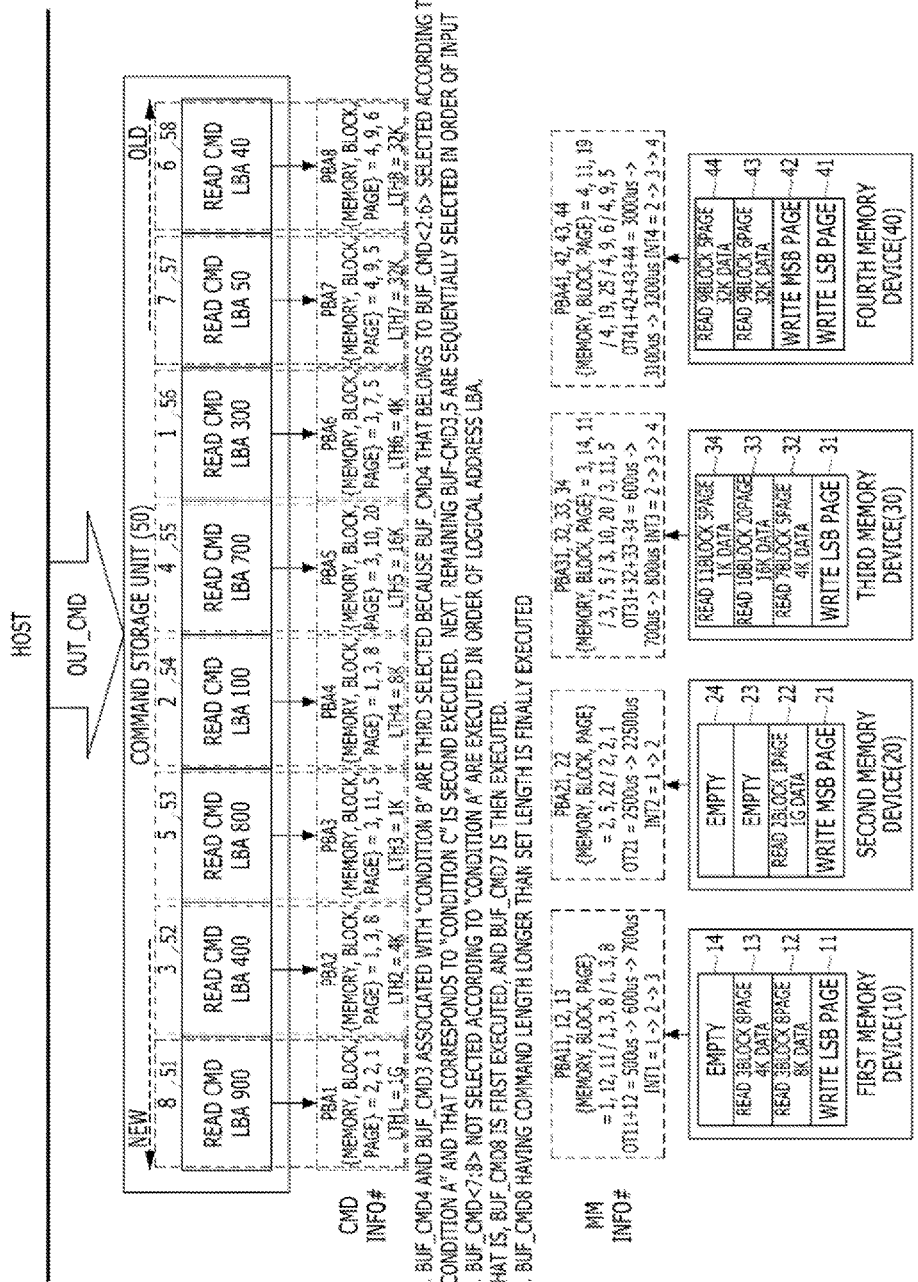

Referring to FIG. 14D, it may be seen that a process of distributing the remaining second command BUF_CMD2, third command BUF_CMD3, and fifth command BUF_CMD5 after the sixth command BUF_CMD6 is distributed to the third memory device 30 and the fourth command BUF_CMD4 is distributed to the first memory device 10 in FIG. 14C.

Commands that belong to the second command BUF_CMD2, the third command BUF_CMD3, and the fifth command BUF_CMD5 and that are classified into "first resetting commands" because they comply with the first condition "Condition A" include the second command BUF_CMD2, the third command BUF_CMD3, and the fifth command BUF_CMD5. Furthermore, a command that belongs to the second command BUF_CMD2, the third command BUF_CMD3, and the fifth command BUF_CMD5 and that is classified as a "third resetting command" because it complies with the second condition "Condition B" includes the second command BUF_CMD2. More specifically, it may be seen that the second command BUF_CMD2 complies with the second condition "Condition B" because the physical address PBA2 of the second command BUF_CMD2 is identical with the physical address PBA12 of the second command MM_CMD12 of the first memory device 10, that is, the eighth page of the third block of the first memory device 10, i.e., {MEMORY, BLOCK, PAGE}=1, 3, 8. A third sequence is immediately assigned to the second command BUF_CMD2 without considering the third condition "Condition C." Accordingly, the reference numeral "3" assigned to the second command BUF_CMD2 denotes that the second command BUF_CMD2 is executed third.

Furthermore, if the second command BUF_CMD2 is executed third, it means that the second command BUF_CMD2 is distributed to and stored in the first memory device 10. Accordingly, information regarding commands stored in the first memory device 10 is changed as follows.

Three commands MM_CMD11, MM_CMD12, and MM_CMD13 have been stored in the first memory device 10, the first command MM_CMD11 of the first memory device 10 is a command for writing data, and the second and the third commands MM_CMD1<2:3> of the first memory device 10 are commands for reading data. Execution information MM_INFO11 on the first command MM_CMD11 of the first memory device 10 is described below. The physical address PBA11 indicates the eleventh page of the twelfth block of the first memory device 10, i.e., {MEMORY, BLOCK, PAGE}=1, 12, 11. Execution information MM_INFO12 on the second command MM_CMD12 of the first memory device 10 is described below. The physical address PBA12 indicates the eighth page of the third block of the first memory device 10, i.e., {MEMORY, BLOCK, PAGE}=1, 3, 8. Execution information MM_INFO13 on the third command MM_CMD13 of the first memory device 10 is described below. A physical address PBA13 indicates the eighth page of the third block of the first memory device 10, i.e., {MEMORY, BLOCK, PAGE}=1, 3, 8. The total execution time OT11+12+13 of the first command MM_CMD11, the second command MM_CMD12, and the third command MM_CMD13 of the first memory device 10 becomes 700 us.

The execution sequence OUT_ORDER2 of the second command BUF_CMD2 has been determined by the resetting operation S133 through the first condition "Condition A"

and the second condition "Condition B", but the execution sequences OUT_ORDER3 and OUT_ORDER5 of the third command BUF_CMD3 and the fifth command BUF_CMD5 have not been determined. Accordingly, the resetting operation S133 is repeatedly performed.

Commands that belong to the third command BUF_CMD3 and the fifth command BUF_CMD5 and are classified into "first resetting commands" because they comply with the first condition "Condition A" include the third command BUF_CMD3 and the fifth command BUF_CMD5. Furthermore, both the third command BUF_CMD3 and the fifth command BUF_CMD5 are classified into "fourth resetting commands" because there is no command that belongs to the third command BUF_CMD3 and the fifth command BUF_CMD5 and that complies with the second condition "Condition B." Furthermore, both the third command BUF_CMD3 and the fifth command BUF_CMD5 are classified into "fifth resetting commands" because they comply with the third condition "Condition C." A fourth sequence is assigned to the fifth command BUF_CMD5 that belongs to the third command BUF_CMD3 and the fifth command BUF_CMD5 set to the "fifth resetting commands" through such a process and that is first input, and a fifth sequence is assigned to the third command BUF_CMD3.

Accordingly, the reference numeral "4" assigned to the fifth command BUF_CMD5 denotes that the fifth command BUF_CMD5 is fourth executed, and the reference numeral "5" assigned to the third command BUF_CMD3 denotes that the third command BUF_CMD3 is fifth executed.

Furthermore, if the fifth command BUF_CMD5 is fourth executed and the third command BUF_CMD3 is fifth executed, it means that the fifth command BUF_CMD5 and the third command BUF_CMD3 are distributed to and stored in the third memory device 30. Accordingly, information regarding commands stored in the third memory device 30 is changed as follows.

Four commands MM_CMD3<1:4> have been stored in the third memory device 30, the first command MM_CMD31 of the third memory device 30 is a command for writing data, and the second to fourth commands MM_CMD3<2:4> of the third memory device 30 are commands for reading data. At this time, the information INT3 on the number of commands is changed to "4" from "2". Execution information MM_INFO31 on the first command MM_CMD31 of the third memory device 30 is described below. The physical address PBA31 indicates the eleventh page of the fourteenth block of the third memory device 30, i.e., {MEMORY, BLOCK, PAGE}=3, 14, 11. Execution information MM_INFO32 on the second command MM_CMD32 of the third memory device 30 is described below. The physical address PBA32 indicates the fifth page of the seventh block of the third memory device 30, i.e., {MEMORY, BLOCK, PAGE}=3, 7, 5. Execution information MM_INFO33 on the third command MM_CMD33 of the third memory device 30 is described below. A physical address PBA33 indicates the twentieth page of the tenth block of the third memory device 30, i.e., {MEMORY, BLOCK, PAGE}=3, 10, 20. Execution information MM_INFO34 on the fourth command MM_CMD34 of the third memory device 30 is described below. A physical address PBA34 indicates the fifth page of the eleventh block of the third memory device 30, i.e., {MEMORY, BLOCK, PAGE}=3, 11, 5. The total execution time OT31+32+33+24 of the first command MM_CMD31, second command MM_CMD32, third command MM_CMD33, and fourth command MM_CMD34 of the third memory device 30 becomes 800 us.

After the execution sequences OUT_ORDER<2:5> of the second to fifth commands BUF_CMD<2:5> stored in the command storage unit 50 are determined through the aforementioned resetting operation S133, the seventh command BUF_CMD7, the eighth command BUF_CMD8, and the first command BUF_CMD1 whose execution sequences have been previously determined are sequentially executed.

First, if the eighth command BUF_CMD8 is executed sixth and the seventh command BUF_CMD7 is executed seventh, it means that the eighth command BUF_CMD8 and the seventh command BUF_CMD7 are distributed to and stored in the fourth memory device 40. Accordingly, information regarding commands stored in the fourth memory device 40 is changed as follows.

Four commands MM_CMD4<1:4> have been stored in the fourth memory device 40, the first and the second commands MM_CMD4<1:2> of the fourth memory device 40 are commands for writing data, and the third and the fourth commands MM_CMD4<3:4> of the fourth memory device 40 are commands for reading data. At this time, the information INT4 on the number of commands is changed to "4" from "2". Execution information MM_INFO41 on the first command MM_CMD41 of the fourth memory device 40 is described below. The physical address PBA41 indicates the nineteenth page of the eleventh block of the fourth memory device 40, i.e., {MEMORY, BLOCK, PAGE}=4, 11, 19. Execution information MM_INFO42 on the second command MM_CMD42 of the fourth memory device 40 is described below. The physical address PBA42 indicates the twenty-fifth page of the nineteenth block of the fourth memory device 40, i.e., {MEMORY, BLOCK, PAGE}=4, 19, 25. Execution information MM_INFO43 on the third command MM_CMD43 of the fourth memory device 40 is described below. A physical address PBA43 indicates the sixth page of the ninth block of the fourth memory device 40, i.e., {MEMORY, BLOCK, PAGE}=4, 9, 6. Execution information MM_INFO44 on the fourth command MM_CMD44 of the fourth memory device 40 is described below. A physical address PBA44 indicates the fifth page of the ninth block of the fourth memory device 40, i.e., {MEMORY, BLOCK, PAGE}=4, 9, 5. The total execution time OT41+42+43+44 of the first command MM_CMD41, second command MM_CMD42, third command MM_CMD43, and fourth command MM_CMD44 of the fourth memory device 40 becomes 3200 us.

Furthermore, if the first command BUF_CMD1 is executed eighth, it means that the first command BUF_CMD1 is distributed to and stored in the second memory device 20. Accordingly, information regarding commands stored in the second memory device 20 is changed as follows.

The two commands MM_CMD2<1:2> have been stored in the second memory device 20, the first command MM_CMD21 of the second memory device 20 is a command for writing data, and the second command MM_CMD22 of the second memory device 20 is a command for reading data. Execution information MM_INFO21 on the first command MM_CMD21 of the second memory device 20 is described below. The physical address PBA21 indicates the twenty-second page of the fifth block of the second memory device 20, i.e., {MEMORY, BLOCK, PAGE}=2, 5, 22. Execution information MM_INFO22 on the second command MM_CMD22 of the second memory device 20 is described below. A physical address PBA22 indicates the first page of the second block of the second memory device 20, i.e., {MEMORY, BLOCK, PAGE}=2, 2, 1. The total execution time OT21+22 of the first command MM_CMD21 and second command MM_CMD22 of the second memory device 20 becomes 22500 us.

As described above, in accordance with an embodiment of the present invention, the execution conditions of each of a plurality of commands sequentially received from a host is checked, and the order in which the plurality of commands are executed is rearranged. Then, after multiple rearrangement conditions having different priorities is checked, the operation of rearranging the order of the commands is performed.

Accordingly, memory system performance can be maximized.

Furthermore, there is an advantage in that the waiting time of the host for the commands can be minimized.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
    a command storage unit, executed by a controller, configured to store maximum N commands received from a host;
    K memory devices each configured to store maximum M commands based on the maximum N commands and performing each set operation in response to the stored maximum M commands in order of input; and
    a resetting unit, executed by the controller, configured to reset execution sequences of the maximum N commands based on execution information regarding each of the maximum N commands and the maximum M commands in each of the K memory devices whenever the commands received from the host are stored in the command storage unit, and distributing the N commands to the K memory devices,
    wherein the execution information comprises a logical address, a physical address, a length, and a use time of a corresponding command,
    wherein the resetting unit is configured to:
        classify the K memory devices into a first resetting memory device having a high first priority and a second resetting memory device having a low first priority based on a time required to use all the maximum M commands stored in each of the K memory devices, and
        set commands that belong to the maximum N commands and correspond to the first resetting memory device to first resetting commands, and set commands that belong to the maximum N commands and correspond to the second resetting memory device to second resetting commands,
    wherein N is a natural number greater than 2, K is a natural number greater than 2, and M is a natural number greater than 1.

2. The memory system of claim 1, wherein, when the length of the command that has been most recently received from the host and stored in the command storage unit is greater than a set length, the resetting unit excludes the command from a target whose execution sequence is to be reset, sets the excluded command to an exclusion command, and resets execution sequences of remaining (N−1) commands.

3. The memory system of claim 2, wherein, after distributing all the remaining (N−1) commands to the K memory devices, the resetting unit distributes the exclusion command to the K memory devices and distributes a command received from the host after the exclusion command.

4. The memory system of claim 1, wherein the resetting unit is configured to:
    set one or more memory devices that need a relatively short time to use all the maximum M commands stored in each of the K memory devices to the first resetting memory device, and
    set remaining memory devices except for the first resetting memory device to the second resetting memory device.

5. The memory system of claim 1, wherein the resetting unit is configured to:
    classify the one or more first resetting commands into a third resetting command having a high second priority and a fourth resetting command having a low second priority based on a correlation between values of the physical addresses of the maximum M commands stored in each of the one or more first resetting memory devices and values of the physical addresses of the one or more first resetting commands;
    advance an execution sequence of the third resetting command more than an execution sequence of the fourth resetting command; and
    set the first resetting memory device corresponding to the third resetting command to a third resetting memory device, and set the first resetting memory device corresponding to the fourth resetting command to a fourth resetting memory device.

6. The memory system of claim 5, wherein the resetting unit is configured to:
    set the first resetting command that corresponds to where the values of the physical addresses of the one or more first resetting commands are consecutive and have an identical value, to the third resetting command, based on the values of the physical addresses of the M commands stored in each of the one or more first resetting memory devices, and
    set the first resetting command that corresponds to where the values of the physical addresses of the one or more first resetting commands are not consecutive and do not have an identical value, to the fourth resetting command.

7. The memory system of claim 6, wherein the resetting unit is configured to:
    classify the one or more fourth resetting commands into a fifth resetting command having a high third priority and a sixth resetting command having a low third priority based on a number of commands stored in each of the one or more fourth resetting memory devices, and
    advance an execution sequence of the fifth resetting command more than an execution sequence of the sixth resetting command.

8. The memory system of claim 7, wherein the resetting unit is configured to:
    set a fourth resetting command that belongs to the one or more fourth resetting commands and that corresponds to the fourth resetting memory device in which a relatively small number of commands have been stored, to the fifth resetting command, and
    set remaining fourth resetting commands except for the fifth resetting command to the sixth resetting command.

9. The memory system of claim 7, wherein, when the resetting unit classifies two or more commands of the maximum N commands into the sixth resetting commands, execution sequences of the two or more sixth resetting commands are determined in order of input.

10. The memory system of claim 7, wherein the resetting unit combines two or more commands that belong to the maximum N commands and that have values of consecutive logical addresses into a group and simultaneously applies control of the first to the third priorities to the group.

11. The memory system of claim 10, wherein the resetting unit controls execution sequences of the two or more commands included in the group so that a command having a value of a former logical address is first used, a command having a value of a latter logical address is later used, and the commands are always consecutively used.

12. The memory system of claim 1, wherein, when a command received from the host is stored in the command storage unit and a set number of commands or more have been stored in the command storage unit, the resetting unit resets the execution sequences of the maximum N commands stored in the command storage unit and distributes the maximum N commands to the K memory devices.

13. An operation method for storing maximum M commands in each of K memory devices based on maximum N commands received from a host and performing each set operation in response to the maximum M commands in order of input, the operation method comprises:
   sequentially storing the maximum N commands from the host in a set storage space; and
   resetting execution sequences of the maximum N commands stored in the set storage space based on execution information regarding each of the maximum N commands stored in the set storage space and the maximum M commands stored in each of the K memory devices whenever the commands received from the host are stored in the set storage space, and distributing the reset maximum N commands to the K memory devices,
   wherein the execution information comprises a logical address, a physical address, a length, and a use time of a corresponding command,
   wherein the resetting of the execution sequences of the maximum N commands and the distributing of the reset maximum N commands to the K memory devices comprise:
      setting a memory device having a relatively short time required to use all the maximum M commands stored in each of the K memory devices to a first resetting memory device having a high first priority, and setting remaining memory devices except for the first resetting memory device to a second resetting memory device having a low first priority; and
      setting the command that belongs to the maximum N commands stored in the set storage space and that corresponds to the first resetting memory device to a first resetting command, and setting the command that belongs to the maximum N commands stored in the set storage space and that corresponds to the second resetting memory device to a second resetting command,
   wherein N is a natural number greater than 2, K is a natural number greater than 2, and M is a natural number greater than 1.

14. The operation method of claim 13, wherein the resetting of the execution sequences of the maximum N commands and the distributing of the reset maximum N commands to the K memory devices comprise:
   setting the command most recently received from the host and stored in the set storage space to an exclusion command when the length of the most recently stored command is greater than a set length;
   distributing remaining (N−1) commands that are stored in the set storage space prior to the exclusion command to the K memory devices;
   distributing the exclusion command to the K memory devices; and
   distributing the command that is received from the host to the K memory devices after the exclusion command.

15. The operation method of claim 13, wherein the resetting of the execution sequences of the maximum N commands and the distributing of the reset maximum N commands to the K memory devices comprise:
   setting the first resetting command that corresponds to when values of physical addresses of the one or more first resetting commands are consecutive and have an identical value, to a third resetting command having a high second priority, and setting the first resetting command that corresponds to when the values of the physical addresses of the one or more first resetting commands are not consecutive and do not have an identical value, to a fourth resetting command having a low second priority, based on the values of the physical addresses of the M commands stored in each of the one or more first resetting memory devices;
   advancing an execution sequence of the third resetting command more than an execution sequence of the fourth resetting command; and
   setting the first resetting memory device corresponding to the third resetting command to a third resetting memory device, and setting the first resetting memory device corresponding to the fourth resetting command to a fourth resetting memory device.

16. The operation method of claim 15, wherein the resetting of the execution sequences of the maximum N commands and the distributing of the reset maximum N commands to the K memory devices comprise:
   setting the fourth resetting command that belongs to the one or more fourth resetting memory devices and stores the command having a relatively small number of commands stored in each of the one or more fourth resetting memory devices, to a fifth resetting command having a high third priority, and setting remaining fourth resetting commands except for the fifth resetting command to sixth resetting commands, and
   advancing an execution sequence of the fifth resetting command more than an execution sequence of the sixth resetting command.

17. The operation method of claim 16, wherein in the resetting of the execution sequences of the maximum N commands and the distributing of the reset maximum N commands to the K memory devices, when one or more of the maximum N commands stored in the set storage space are classified into the sixth resetting commands, execution sequences of the two or more sixth resetting commands are determined in order of input.

18. The operation method of claim 16, wherein two or more commands that belong to the maximum N commands stored in the set storage space and that have values of consecutive logical addresses are formed into a group, and control of the first to third priorities is simultaneously applied to the group.

* * * * *